United States Patent
Chen et al.

(10) Patent No.: US 11,810,883 B2
(45) Date of Patent: Nov. 7, 2023

(54) PACKAGE STRUCTURE

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 129 days.

(21) Appl. No.: 17/325,649

(22) Filed: May 20, 2021

(65) Prior Publication Data

US 2022/0223557 A1     Jul. 14, 2022

Related U.S. Application Data

(60) Provisional application No. 63/136,744, filed on Jan. 13, 2021.

(51) Int. Cl.
*H01L 23/00* (2006.01)
*H01L 23/48* (2006.01)
(Continued)

(52) U.S. Cl.
CPC .......... *H01L 24/24* (2013.01); *H01L 23/3135* (2013.01); *H01L 23/481* (2013.01);
(Continued)

(58) Field of Classification Search
CPC ... H01L 24/24; H01L 23/3135; H01L 23/481; H01L 25/0657; H01L 25/0652;
(Continued)

(56) References Cited

U.S. PATENT DOCUMENTS 10,032,722 B2 *   7/2018  Yu ....................... H01L 21/486
2017/0345761 A1  11/2017  Yu et al.
(Continued)

FOREIGN PATENT DOCUMENTS

| KR | 20200037051 A | 4/2020 |
| TW | 202042353 A | 11/2020 |
| TW | 202044528 A | 12/2020 |

*Primary Examiner* — Jasmine J Clark
(74) *Attorney, Agent, or Firm* — Slater Matsil, LLP

(57) ABSTRACT

A package structure including a device die structure, an insulating encapsulant, and a first redistribution circuit is provided. The device die structure includes a first semiconductor die and a second semiconductor die. The first semiconductor die is stacked over and electrically connected to the second semiconductor die. The insulating encapsulant laterally encapsulates the device die structure. The insulating encapsulant includes a first encapsulation portion and a second encapsulation portion connected to the first encapsulation portion. The first encapsulation portion is disposed on the second semiconductor die and laterally encapsulates the first semiconductor die. The second encapsulation portion laterally encapsulates the first insulating encapsulation and the second semiconductor die. The first redistribution circuit structure is disposed on the device die structure and a first surface of the insulating encapsulant, and the first redistribution circuit structure is electrically connected to the device die structure.

20 Claims, 46 Drawing Sheets

(51) Int. Cl.
*H01L 25/10* (2006.01)
*H01L 25/065* (2023.01)
*H01L 25/00* (2006.01)
*H01L 23/31* (2006.01)
*H01L 23/538* (2006.01)

(52) U.S. Cl.
CPC .......... *H01L 24/25* (2013.01); *H01L 25/0652* (2013.01); *H01L 25/0657* (2013.01); *H01L 25/105* (2013.01); *H01L 25/50* (2013.01); H01L 23/5385 (2013.01); H01L 24/08 (2013.01); H01L 24/16 (2013.01); H01L 24/32 (2013.01); H01L 24/73 (2013.01); H01L 2224/08145 (2013.01); H01L 2224/16145 (2013.01); H01L 2224/2402 (2013.01); H01L 2224/24011 (2013.01); H01L 2224/24101 (2013.01); H01L 2224/24175 (2013.01); H01L 2224/25171 (2013.01); H01L 2224/32145 (2013.01); H01L 2224/73204 (2013.01); H01L 2224/73259 (2013.01); H01L 2224/73267 (2013.01); H01L 2225/06568 (2013.01); H01L 2225/1035 (2013.01); H01L 2225/1041 (2013.01); H01L 2225/1058 (2013.01)

(58) Field of Classification Search
CPC ......... H01L 25/50; H01L 24/16; H01L 24/32; H01L 24/73; H01L 2224/08145; H01L 2224/16145; H01L 2224/24011; H01L 2224/2402; H01L 23/3142; H01L 2224/24175; H01L 2224/32145; H01L 2224/73204; H01L 2224/73259; H01L 2224/73267; H01L 2225/06568; H01L 21/76898; H01L 21/56; H01L 23/5389; H01L 21/568; H01L 2224/18; H01L 2224/48091; H01L 2224/48227; H01L 23/49838; H01L 2224/02371; H01L 2224/08135; H01L 24/25; H01L 25/105; H10B 80/00
See application file for complete search history.

(56) References Cited

U.S. PATENT DOCUMENTS

| | | |
|---|---|---|
| 2020/0279793 A1 | 9/2020 | Xie et al. |
| 2020/0303343 A1 | 9/2020 | Manipatruni et al. |
| 2020/0357770 A1 | 11/2020 | Chiang et al. |
| 2020/0365557 A1 | 11/2020 | Tsai et al. |

* cited by examiner

PACKAGE STRUCTURE

CROSS-REFERENCE TO RELATED APPLICATION

This application claims priority to U.S. Provisional Application No. 63/136,744, filed on Jan. 13, 2021, which is hereby incorporated by reference herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
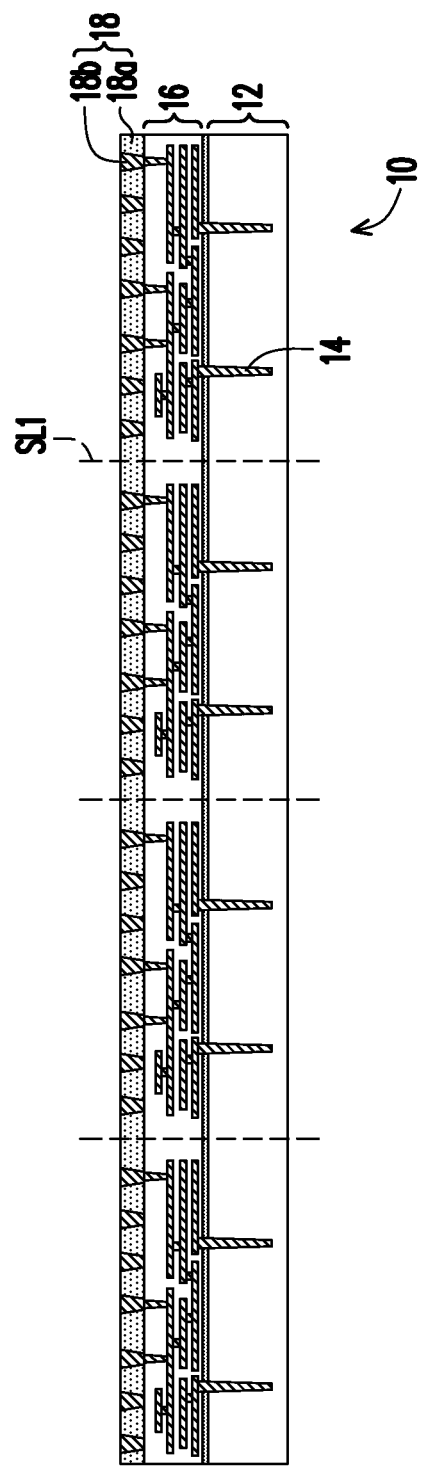
FIGS. 1A through 1D are cross-sectional views schematically illustrating a process flow for fabricating System on Integrated Circuits (SoICs) structures in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Packages and the methods of forming the same are provided in accordance with various exemplary embodiments. The intermediate stages of forming the packages are illustrated. The variations of the embodiments are discussed. Throughout the various views and illustrative embodiments, like reference numbers are used to designate like elements.

FIGS. 1A through 1D are cross-sectional views schematically illustrating a process flow for fabricating System on Integrated Circuit (SoIC) structures in accordance with some embodiments of the present disclosure.

Referring to FIG. 1A, a wafer 10 including semiconductor dies is provided. The semiconductor dies may be logic dies, System-on-Chip (SoC) dies or other suitable semiconductor dies. The wafer 10 may include a substrate 12 (e.g., a semiconductor substrate), through substrate vias (TSV) 14 embedded in the substrate 12, an interconnect structure 16 disposed on the substrate 12, and a bonding structure 18 disposed on the interconnect structure 16, wherein the through substrate vias 14 are electrically connected to the interconnect structure 116. The substrate 12 of the semiconductor wafer 10 may include a crystalline silicon wafer. The substrate 12 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the substrate 12 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The through substrate vias 14 may be formed by forming recesses in the substrate 12 by, for example, etching, milling, laser techniques, a combination thereof, and/or the like. A thin barrier layer may be conformally deposited over the front side of the substrate 12 and in the openings, such as by chemical vapor deposition (CVD), atomic layer deposition (ALD), physical vapor deposition (PVD), thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material is deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer may be removed from the front side of the substrate 12 by, for example, chemical mechanical polishing. Thus, in some embodiments, the through substrate vias 14 may comprise a conductive material and a thin barrier layer between the conductive material and the substrate 12.

The interconnect structure 16 may include one or more dielectric layers (for example, one or more interlayer dielectric (ILD) layers, intermetal dielectric (IMD) layers, or the like) and interconnect wirings embedded in the one or more dielectric layers, and the interconnect wirings are electrically connected to the semiconductor devices (e.g., FinFETs) formed in the substrate 12 and/or the through substrate vias 14. The material of the one or more dielectric layers may include silicon oxide ($SiO_x$, where x>0), silicon nitride ($SiN_x$, where x>0), silicon oxynitride ($SiO_xN_y$, where x>0 and y>0) or other suitable dielectric material. The interconnect wirings may include metallic wirings. For example, the interconnect wirings include copper wirings, copper pads, aluminum pads or combinations thereof. In some embodiments, the through substrate vias 14 may extend through one or more layers of the interconnect structure 16 and into the substrate 12.

The bonding structure 18 may include a bonding dielectric layer 18a and bonding conductors 18b embedded in the bonding dielectric layer 18a. The material of the bonding dielectric layer 18a may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 18b may be conductive vias (e.g., copper vias), conductive pads (e.g., copper pads) or combinations thereof. The bonding structure 18 may be formed by depositing a dielectric material through a chemical vapor deposition (CVD) process (e.g., a plasma enhanced CVD process or other suitable process); patterning the dielectric material to form the bonding dielectric layer 18a including openings or through holes; and filling conductive material in the openings or through holes defined in the bonding dielectric layer 18a to form the bonding conductors 18b embedded in the bonding dielectric layer 18a.

Figure 1B:
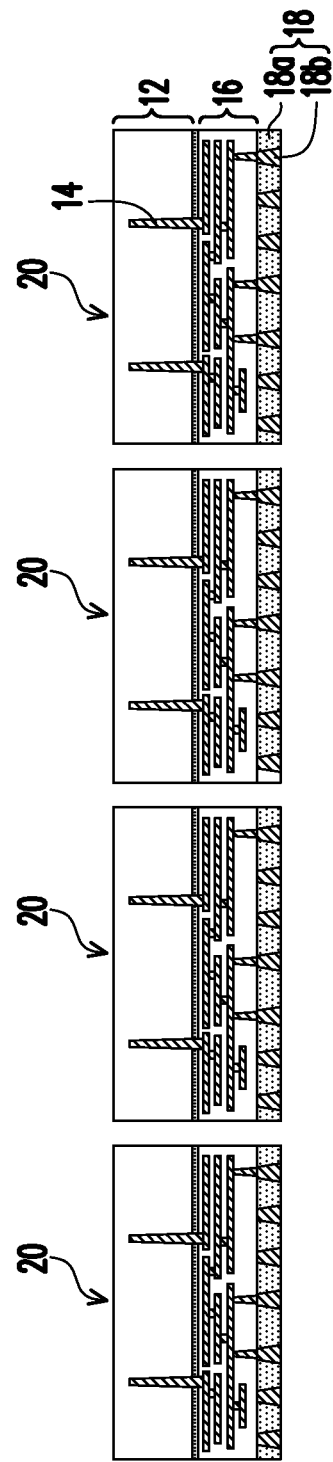

Referring to FIG. 1A and FIG. 1B, the semiconductor wafer 10 is singulated by a wafer sawing process performed along scribe lines SL1 such that singulated semiconductor dies 20 are obtained. Each of the singulated semiconductor dies 20 may include a substrate 12, through substrate vias 14 embedded in the substrate 12, an interconnect structure 16 disposed on the substrate 12, and a bonding structure 18 disposed on the interconnect structure 16. As illustrated in FIG. 1B, the through substrate vias 14 are buried in the substrate 12 and the interconnect structure 16. The through substrate vias 14 are not revealed from a back surface of the substrate 12 at this stage.

Figure 1C:
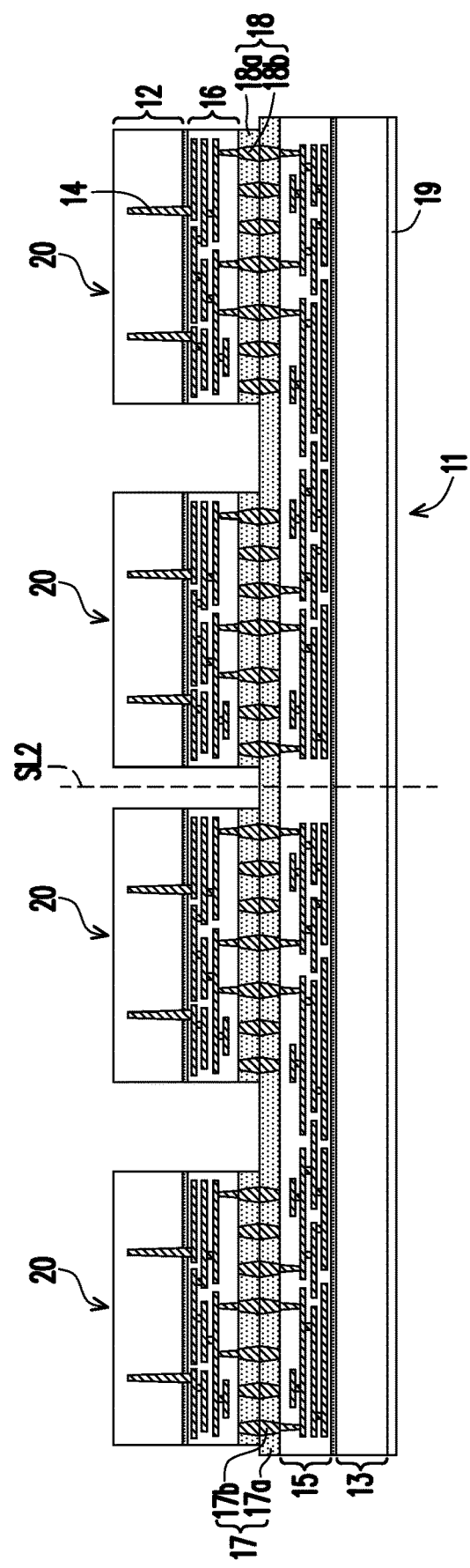

Referring to FIG. 1C, a semiconductor wafer 11 including semiconductor dies is provided. The semiconductor dies may be logic dies, System-on-Chip (SoC) dies or other suitable semiconductor dies. The semiconductor dies 20 and the semiconductor dies in the semiconductor wafer 11 may perform the same function or different functions. In some embodiments, the semiconductor dies 20 and the semiconductor dies in the semiconductor wafer 11 are System on Chip (SoC) dies. The semiconductor wafer 11 may include a substrate 13 (e.g., a semiconductor substrate), an interconnect structure 15 disposed on the substrate 13, and a bonding structure 17 disposed on the interconnect structure 15. In some embodiments, a die-attachment film 19 is attached to a back surface of the semiconductor wafer 11. The substrate 13 of the semiconductor wafer 11 may include a crystalline silicon wafer. The substrate 13 may include various doped regions depending on design requirements (e.g., p-type substrate or n-type substrate). In some embodiments, the doped regions may be doped with p-type or n-type dopants. The doped regions may be doped with p-type dopants, such as boron or $BF_2$; n-type dopants, such as phosphorus or arsenic; and/or combinations thereof. The doped regions may be configured for n-type Fin-type Field Effect Transistors (FinFETs) and/or p-type FinFETs. In some alternative embodiments, the substrate 13 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

The interconnect structure 15 may include one or more dielectric layers (for example, one or more interlayer dielectric (ILD) layers, intermetal dielectric (IMD) layers, or the like) and interconnect wirings embedded in the one or more dielectric layers, and the interconnect wirings are electrically connected to the semiconductor devices (e.g., FinFETs) formed in the substrate 12. The material of the one or more dielectric layers may include silicon oxide ($SiO_x$, where x>0), silicon nitride ($SiN_x$, where x>0), silicon oxynitride ($SiO_xN_y$, where x>0 and y>0) or other suitable dielectric material. The interconnect wirings may include metallic wirings. For example, the interconnect wirings include copper wirings, copper pads, aluminum pads or combinations thereof.

The bonding structure 17 may include a bonding dielectric layer 17a and bonding conductors 17b embedded in the bonding dielectric layer 17a. The material of the bonding dielectric layer 17a may be silicon oxide ($SiO_x$, where x>0), silicon nitride ($SiN_x$, where x>0), silicon oxynitride ($SiO_xN_y$, where x>0 and y>0) or other suitable dielectric material, and the bonding conductors 17b may be conductive vias (e.g., copper vias), conductive pads (e.g., copper pads) or combinations thereof. The bonding structure 17 may be formed by depositing a dielectric material through a chemical vapor deposition (CVD) process (e.g., a plasma enhanced CVD process or other suitable process); patterning the dielectric material to form the bonding dielectric layer 17a including openings or through holes; and filling conductive material in the openings or through holes defined in the bonding dielectric layer 17a to form the bonding conductors 17b embedded in the bonding dielectric layer 17a.

The singulated semiconductor dies 20 are picked-up, placed on and bonded to the semiconductor wafer 11 through a chip-to-wafer bonding process such that the bonding structures 18 of the singulated semiconductor dies 20 are in contact with the bonding structure 17 of the semiconductor wafer 11. A bonding process is performed to bond the bonding structures 18 of the singulated semiconductor dies 20 with the bonding structure 17 of the semiconductor wafer 11. The bonding process may be a hybrid bonding process that includes dielectric-to-dielectric bonding and metal-to-metal bonding. After performing the above-mentioned bonding process, a dielectric-to-dielectric bonding interface is formed between the bonding dielectric layer 18a and the bonding dielectric layer 17a, and metal-to-metal bonding interfaces are formed between the bonding conductors 18c and bonding conductors 17b.

Figure 1D:
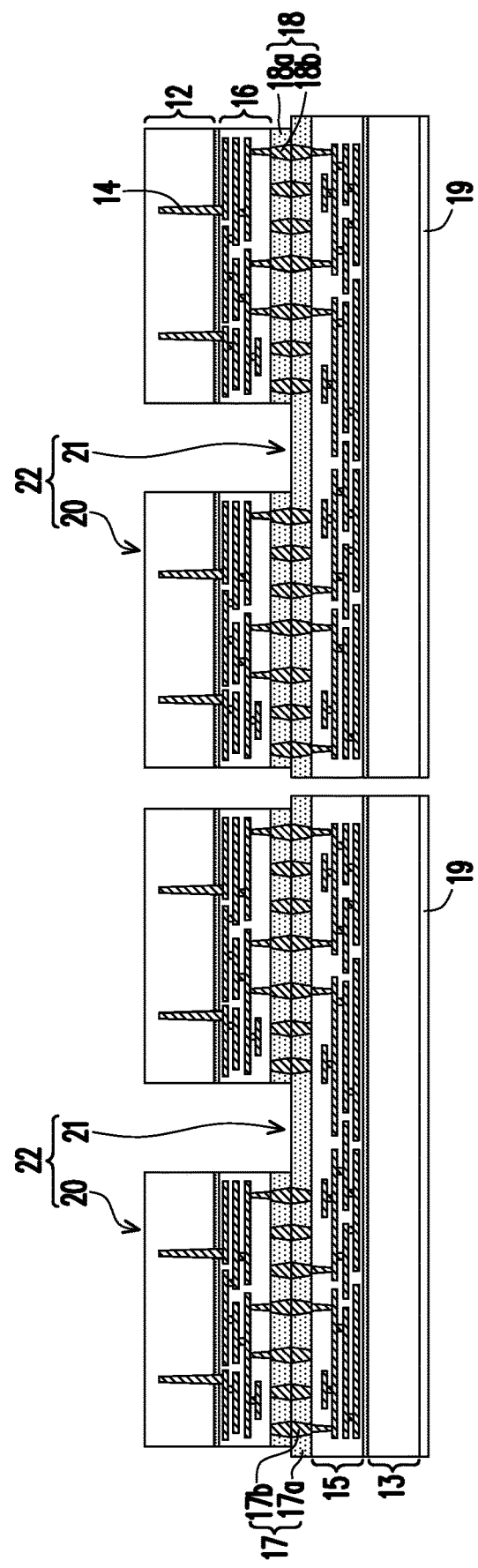

Referring to FIG. 1C and FIG. 1D, the semiconductor wafer 11 and the die-attachment film 19 are singulated by a wafer sawing process performed along scribe lines SL2 such that multiple singulated device dies or SoIC dies 22 are obtained. Each of the singulated SoIC dies 22 may include a singulated semiconductor die 21 and a singulated semiconductor die 20 stacked over the singulated semiconductor die 21, wherein the singulated semiconductor die 20 and the singulated semiconductor die 21 are bonded in a face-to-face manner. As illustrated in FIG. 1D, in each of the singulated SoIC dies 22, portions of the bonding dielectric layer 17a of the singulated semiconductor die 21 are exposed. The lateral dimension (e.g., width and/or length) of the singulated semiconductor die 21 may be greater than the lateral dimension (e.g., width and/or length) of the singulated semiconductor die 20.

Figure 2A:
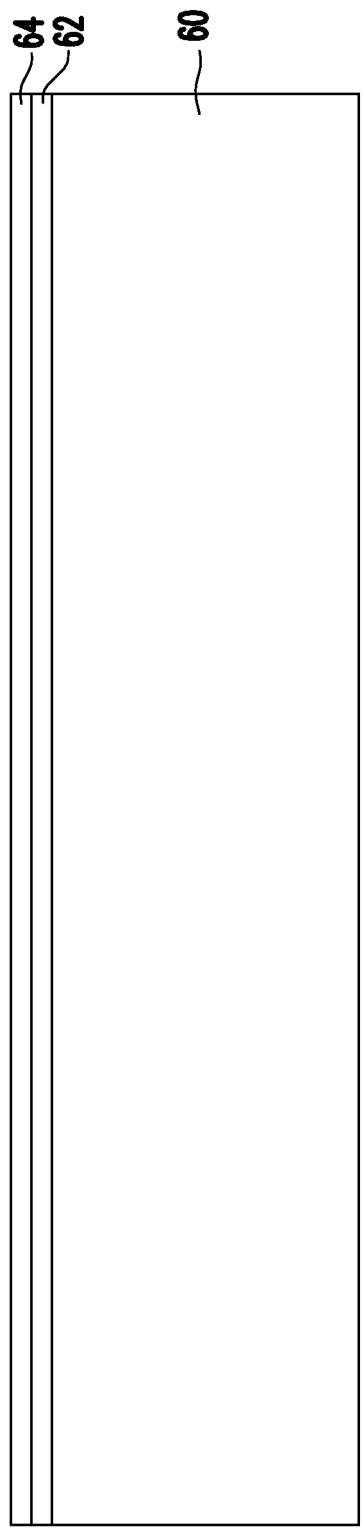
FIGS. 2A through 2N are cross-sectional views schematically illustrating a process flow for fabricating integrated fan-out package structures of SoIC structures in accordance with some embodiments of the present disclosure.
Figure 2B:
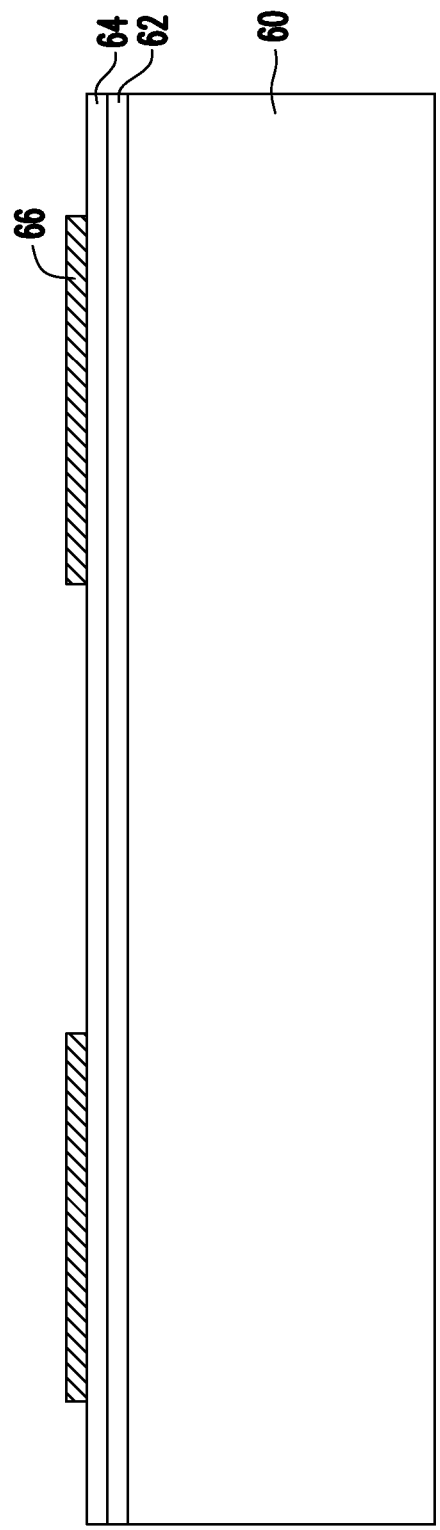
Figure 2C:
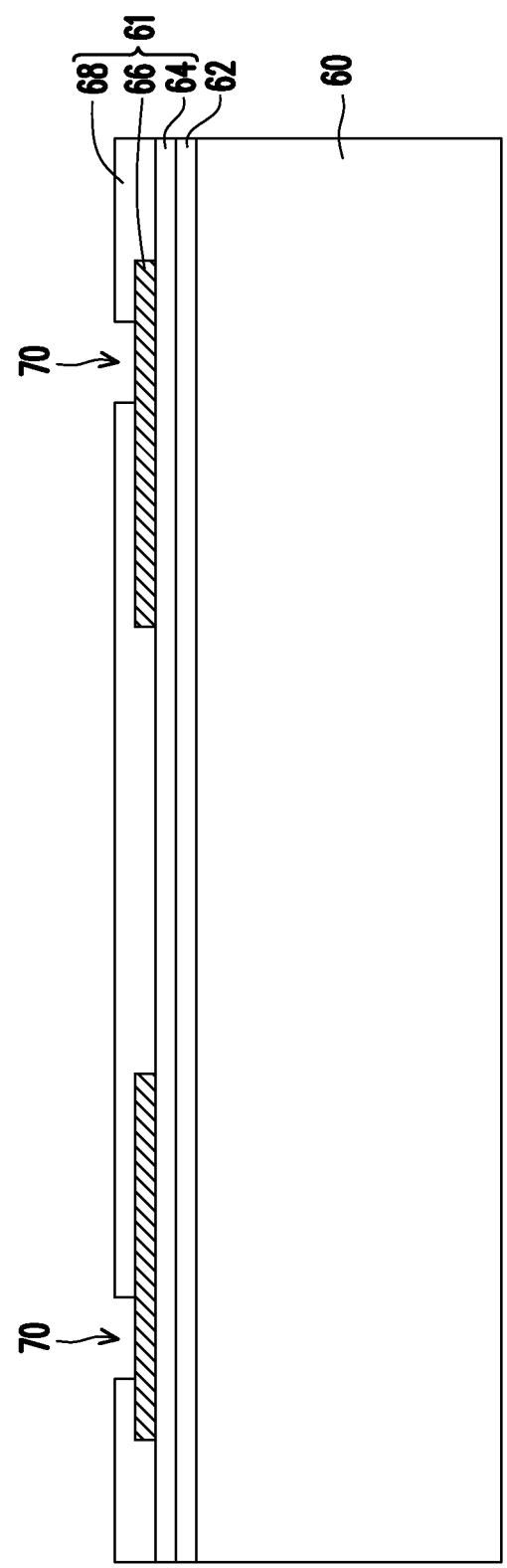
Figure 2D:
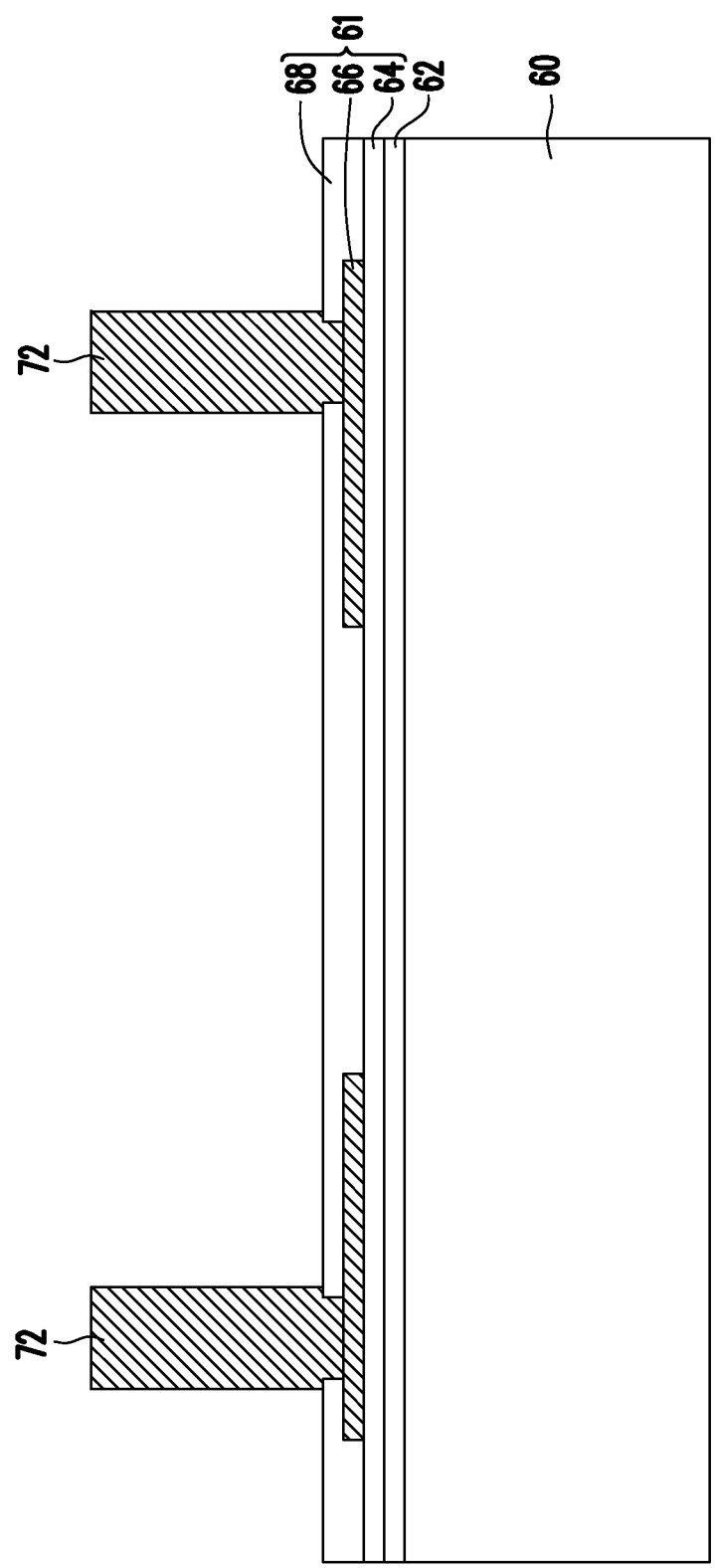
Figure 2E:
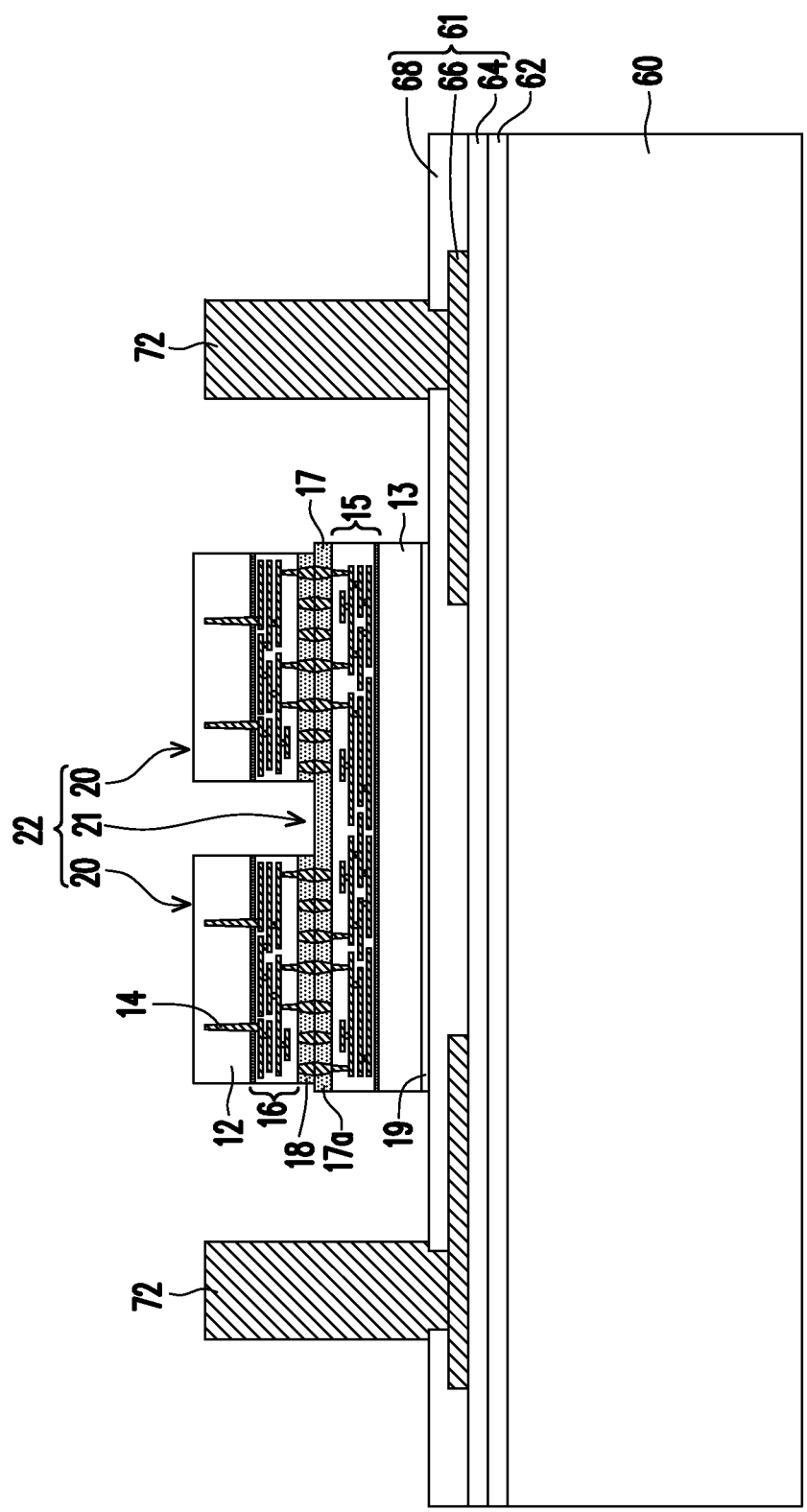
Figure 2F:
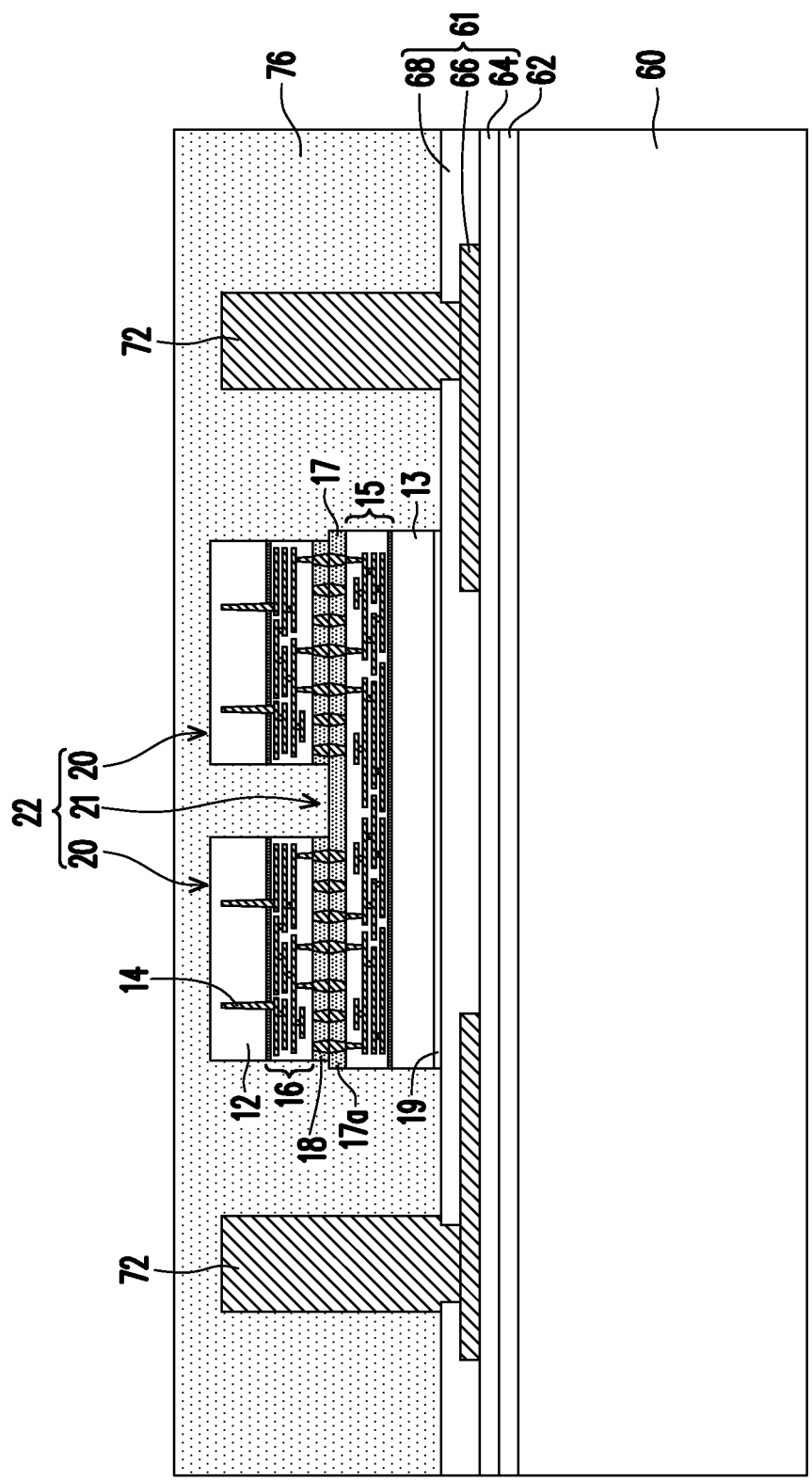
Figure 2G:
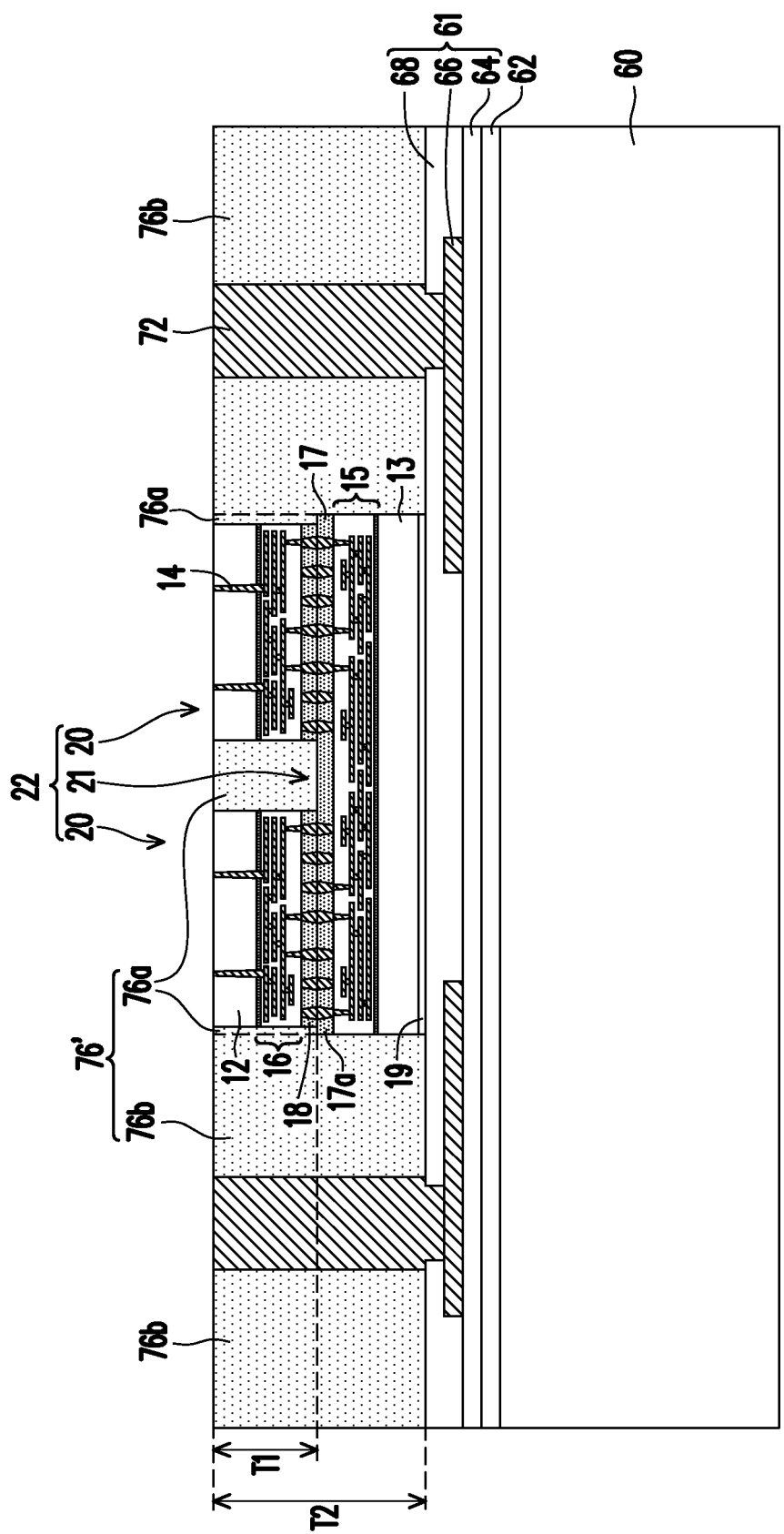
Figure 2H:
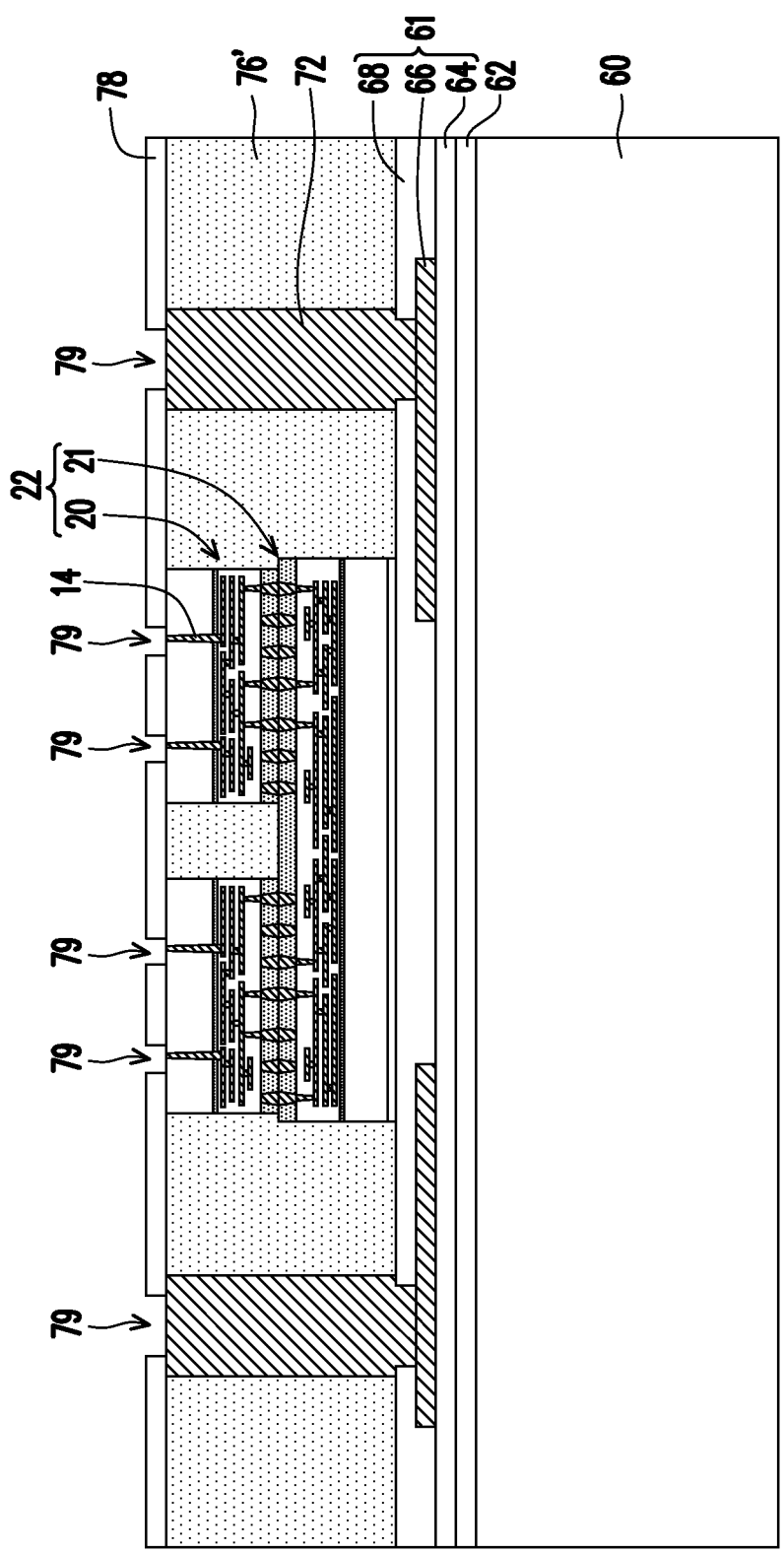
Figure 2I:
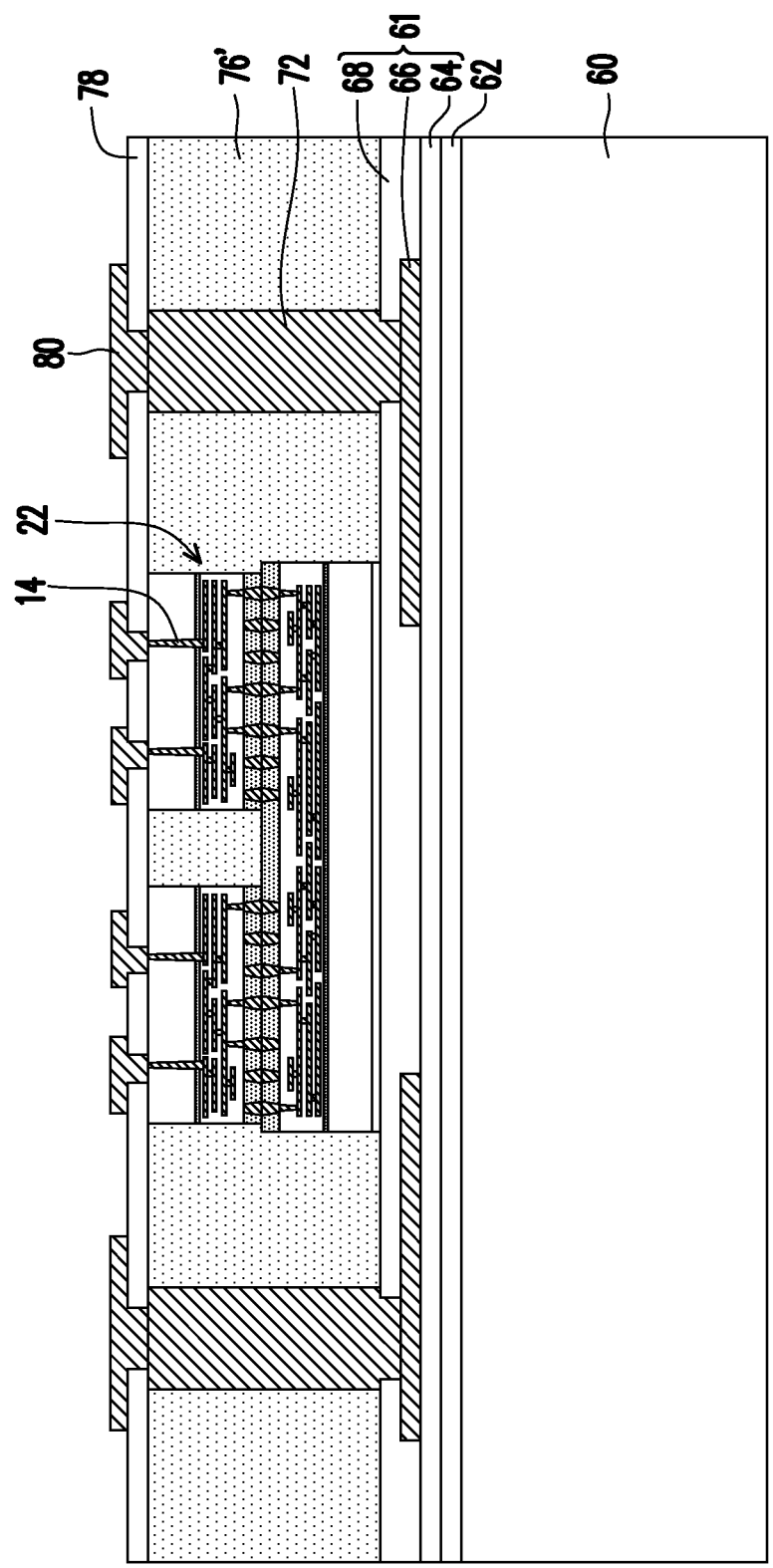
Figure 2J:
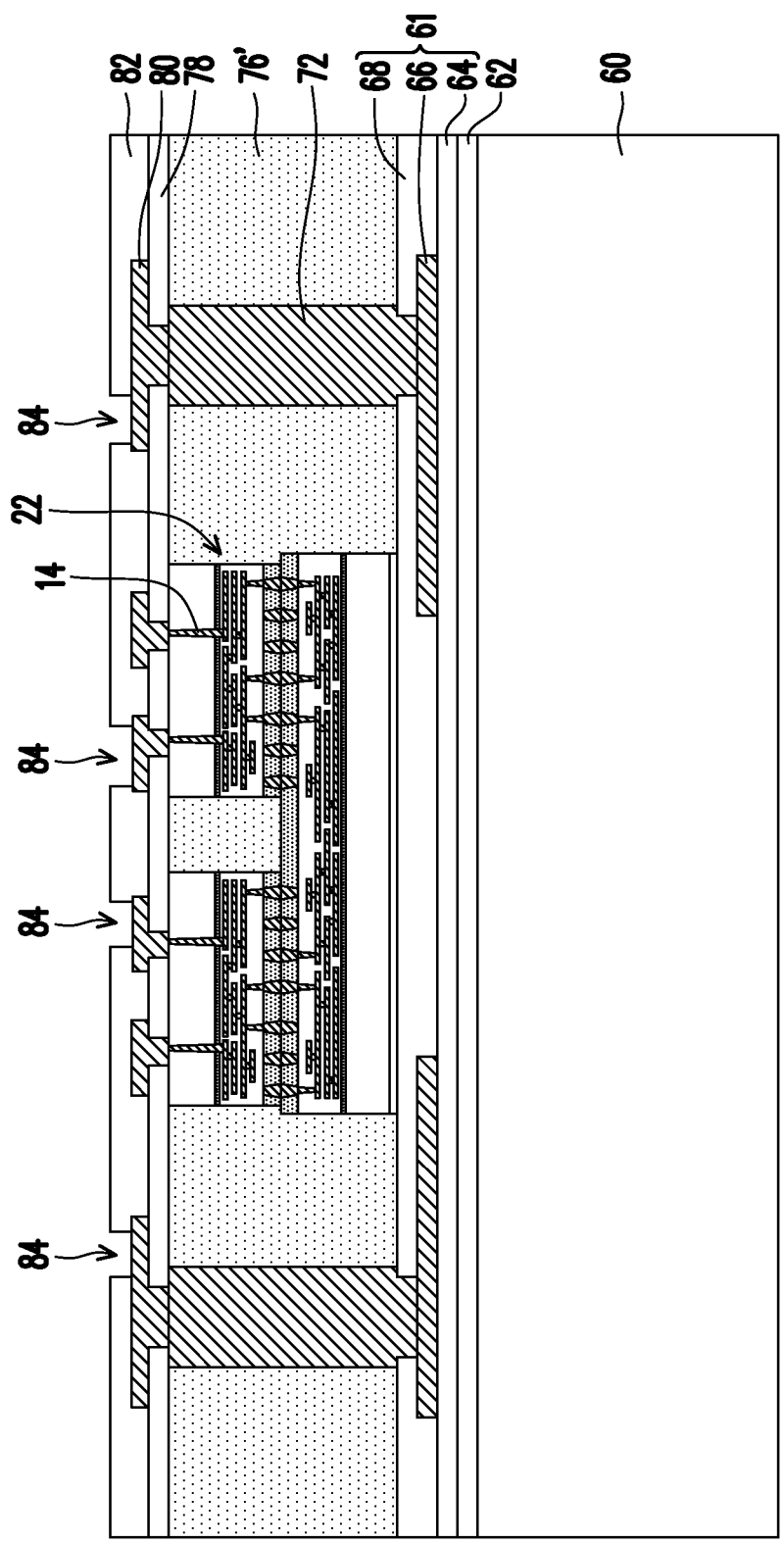
Figure 2K:
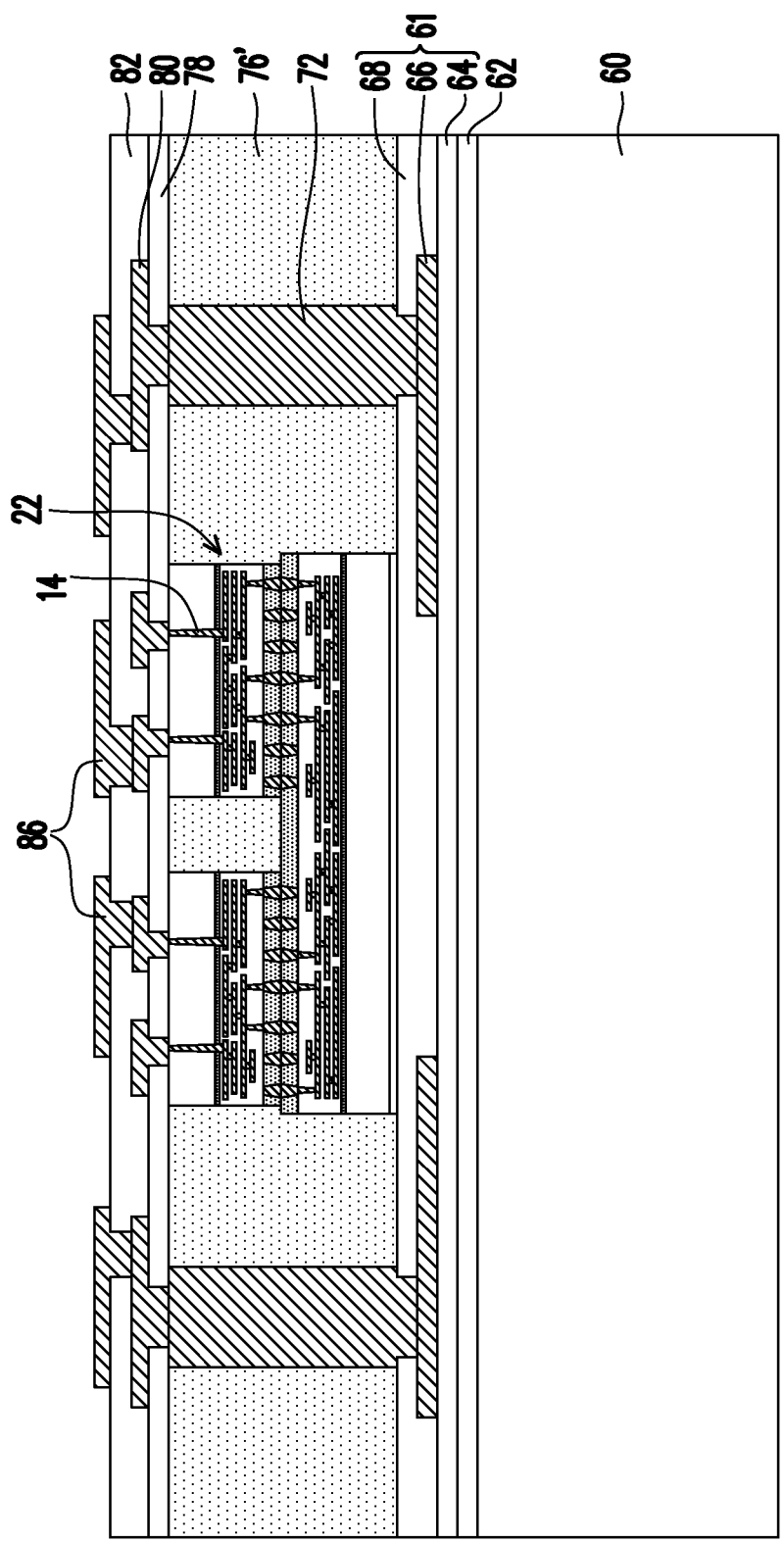
Figure 2L:
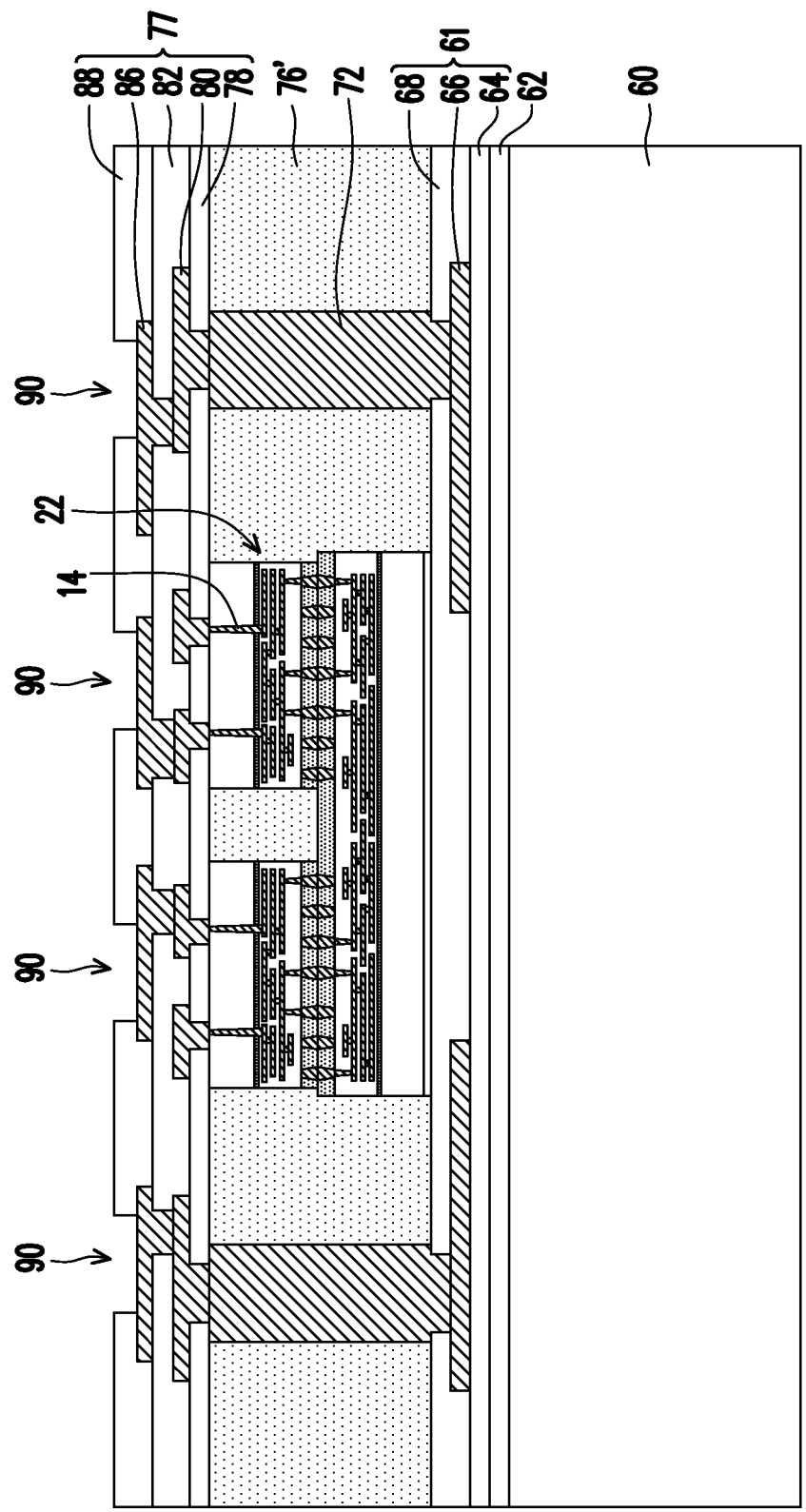
Figure 2M:
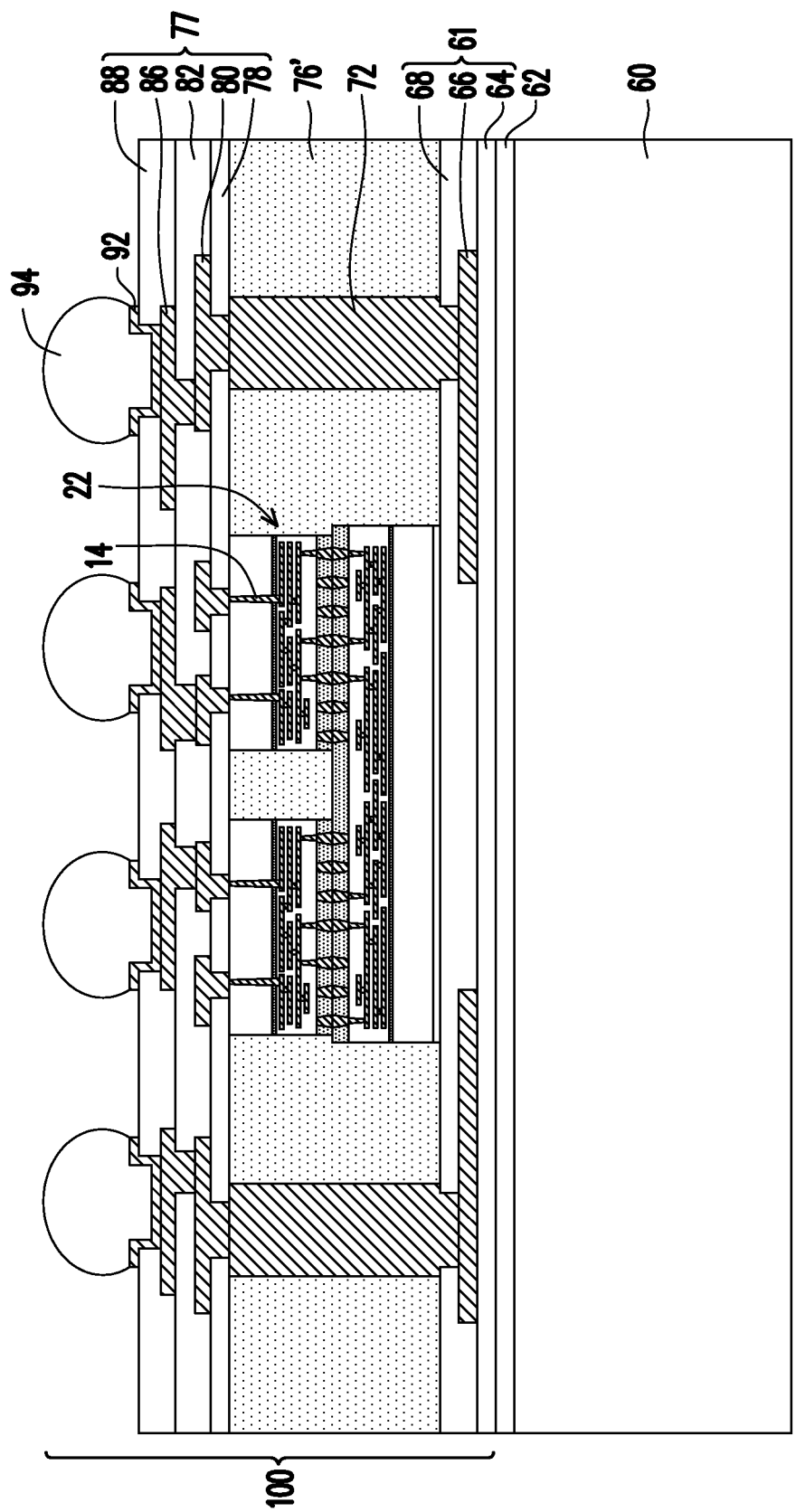
Figure 2N:
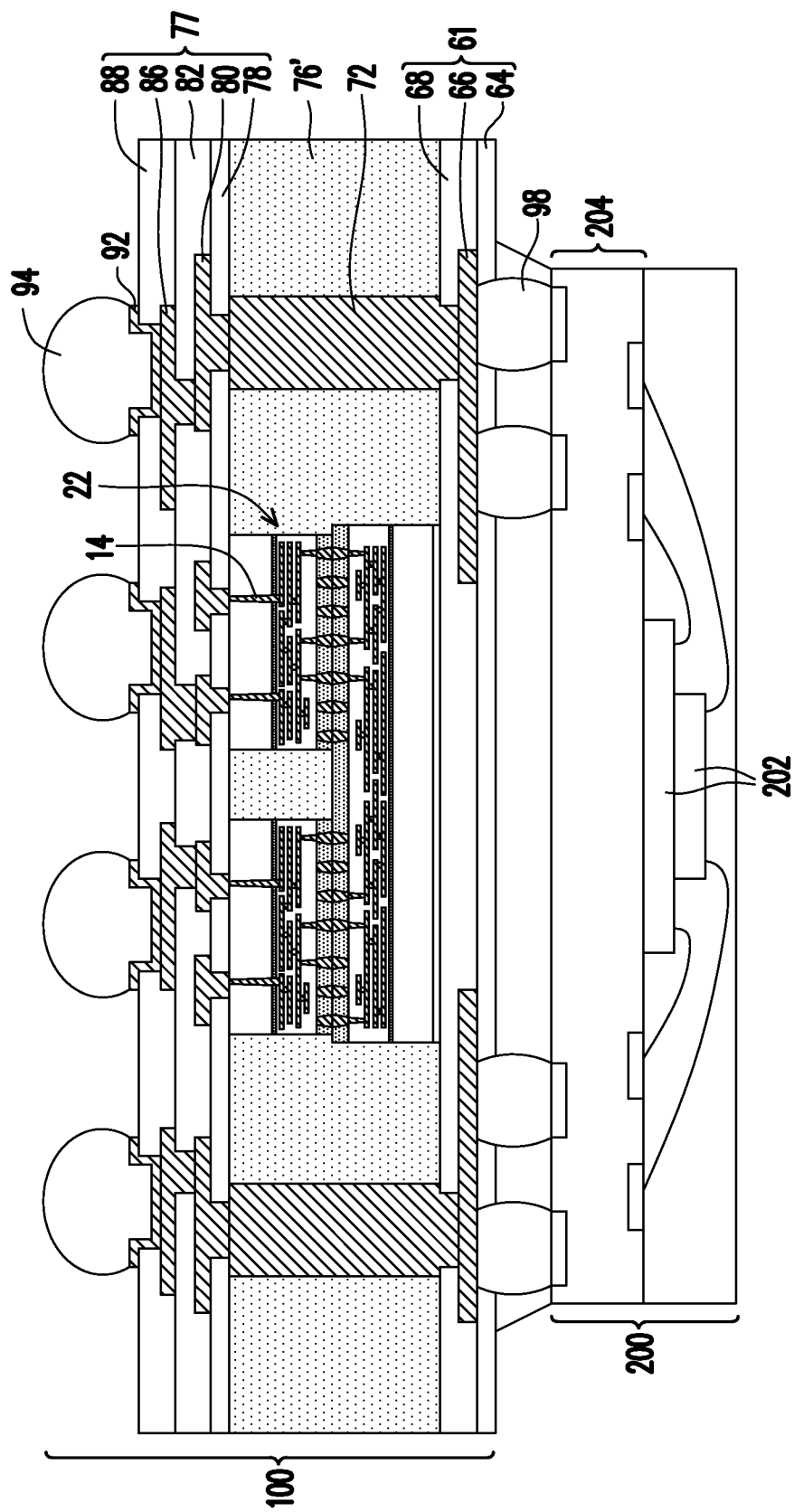

FIGS. 2A through 2N are cross-sectional views schematically illustrating a process flow for fabricating integrated fan-out (InFO) package structures of SoIC dies in accordance with some embodiments of the present disclosure. FIGS. 2A through 2N illustrate the packaging process of the SoIC dies 22 shown in FIG. 1D to form InFO package structures, so that the overlying electrical connectors (such as solder regions) may be distributed to regions larger than the SoIC dies 22.

Referring to FIG. 2A, a carrier 60 including a de-bonding layer 62 formed thereon is provided. In some embodiments, the carrier 60 is a glass substrate, a ceramic carrier, or the like. The carrier 60 may have a round top-view shape and a size of a silicon wafer. For example, carrier 60 may have an 8-inch diameter, a 12-inch diameter, or the like. The de-bonding layer 62 may be formed of a polymer-based material (e.g., a Light To Heat Conversion (LTHC) material), which may be subsequently removed along with the carrier 60 from the overlying structures that will be formed in subsequent steps. In some embodiments, the de-bonding layer 62 is formed of an epoxy-based thermal-release material. In other embodiments, the de-bonding layer 62 is formed of an ultra-violet (UV) glue. The de-bonding layer 62 may be dispensed as a liquid and cured. In alternative embodiments, the de-bonding layer 62 is a laminate film and is laminated onto the carrier 60. The top surface of the de-bonding layer 62 is substantially planar.

Referring to FIGS. 2A through 2C, a redistribution circuit structure 61 including a dielectric layer 64, redistribution wirings 66 and a dielectric layer 68 is formed on the de-bonding layer 62 such that the de-bonding layer 62 is between the carrier 60 and the dielectric layer 64 of the redistribution circuit structure 61. As shown in FIG. 2A, the dielectric layer 64 is formed on the de-bonding layer 62. In some embodiments, the dielectric layer 64 is formed of a polymer, which may also be a photo-sensitive material such as polybenzoxazole (PBO), polyimide, benzocyclobutene (BCB), or the like, which may be easily patterned using a photolithography process. In some embodiments, the dielectric layer 64 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. As shown in FIG. 2B, the redistribution wirings 66 are formed over the dielectric layer 64. The formation of the redistribution wirings 66 may include forming a seed layer (not shown) over the dielectric layer 64, forming a patterned mask (not shown) such as a photoresist layer over the seed layer, and then performing a plating process on the exposed seed layer. The patterned mask and the portions of the seed layer covered by the patterned mask are then removed, leaving the redistribution wirings 66 as shown in FIG. 2B. In accordance with some embodiments, the seed layer includes a titanium layer and a copper layer over the titanium layer. The seed layer may be formed using, for example, Physical Vapor Deposition (PVD). The plating may be performed using, for example, electroless plating. As shown in FIG. 2C, the dielectric layer 68 is formed over the dielectric layer 64 to cover the redistribution wirings 66. The bottom surface of the dielectric layer 68 is in contact with the top surfaces of the redistribution wirings 66 and the dielectric layer 64. In accordance with some embodiments of the present disclosure, the dielectric layer 68 is formed of a polymer, which may be a photo-sensitive material such as PBO, polyimide, BCB, or the like. In some embodiments, the dielectric layer 68 is formed of a nitride such as silicon nitride, an oxide such as silicon oxide, PSG, BSG, BPS G, or the like. The dielectric layer 68 is then patterned to form openings 70 therein. Hence, portions of the redistribution wirings 66 are exposed through the openings 70 in the dielectric layer 68. FIG. 2C and the subsequent figures illustrate a single redistribution circuit structure 61 having single-layer redistribution wirings 66 for illustrative purposes and some embodiments may have a plurality of layers of redistribution wirings 66 by repeating the process discussed above.

Referring to FIG. 2D, after forming the redistribution circuit structure 61 over the de-bonding layer 62 carried by the carrier 60, metal posts 72 are formed on the redistribution circuit structure 61 and electrically connected to the redistribution wirings 66 of the redistribution circuit structure 61. Throughout the description, the metal posts 72 are also referred to as conductive through vias 72 since the metal posts 72 penetrate through the subsequently formed molding material (shown in FIG. 2G). In some embodiments, the conductive through vias 72 are formed by plating. The plating of the conductive through vias 72 may include forming a blanket seed layer (not shown) over the dielectric layer 68 and extending into the openings 70 shown in FIG. 2C, forming and patterning a photoresist (not shown), and plating the conductive through vias 72 on the portions of the seed layer that are exposed through the openings in the photoresist. The photoresist and the portions of the seed layer that were covered by the photoresist are then removed. The material of the conductive through vias 72 may include copper, aluminum, or the like. The conductive through vias 72 may have the shape of rods. The top-view shapes of the conductive through vias 72 may be circles, rectangles, squares, hexagons, or the like.

Referring FIG. 2E, after forming the conductive through vias 72, at least one singulated SoIC die, e.g., such as that the singulated SoIC die 22 shown in FIG. 1D, is picked-up and placed over the dielectric layer 68 of the redistribution circuit structure 61. Only a single singulated SoIC die 22 and its surrounding conductive through vias 72 are illustrated in FIG. 2E for illustrative purposes. It is noted, however, that the process steps shown in FIGS. 2A through 2N may be performed at wafer level, and are performed on all of the singulated SoIC dies 22 and the conductive through vias 72 disposed over the carrier 60 in some embodiments. As illustrated in FIG. 2E, the top tier semiconductor dies 20 are stacked over the bottom tier semiconductor die 21, and the back surface of the bottom tier semiconductor die 21 in the singulated SoIC die 22 is adhered to the dielectric layer 68 through the die-attachment film 19. In some embodiments, the die-attachment film 19 is an adhesive film (e.g., epoxy film, silicone film, and so on).

Referring to FIG. 2F, an insulating encapsulation material 76 is formed over the redistribution circuit structure 61 to cover the SoIC die 22 and the conductive through vias 72. The insulating encapsulation material 76 may be a molding compound (e.g., epoxy or other suitable resin) formed through an over-molding process. The insulating encapsulation material 76 fills the gaps between neighboring conductive through vias 72, the gaps between the top tier semiconductor dies 20, and the gaps between the conductive through vias 72 and the SoIC die 22. The top surface of the insulating encapsulation material 76 is higher than the back surface of the top tier semiconductor dies 20 and the conductive through vias 72.

Next, as shown in FIG. 2G, a planarization such as a Chemical Mechanical Polish (CMP) process and/or a mechanical grinding process is performed to partially remove the insulating encapsulation material 76 until the conductive through vias 72, the substrates 12 and the through substrate vias 14 in the top tier semiconductor dies 20 are exposed. After the insulating encapsulation material 76 is thinned down, an insulating encapsulant 76' is formed to laterally encapsulate the SoIC die 22 and the conductive through vias 72. Due to the planarization, the top ends of conductive through vias 72 are substantially level or coplanar with the back surface of the top tier semiconductor dies 20, and are substantially level or coplanar with the top surface of the insulating encapsulant 76', within process variations. In the illustrated exemplary embodiments, the planarization is performed until the conductive through vias 72 and the through substrate vias 14 in the top tier semiconductor dies 20 are exposed. The substrates 12 of the top tier semiconductor dies 20 are partially removed until the through substrate vias 14 are exposed.

As shown in FIG. 2G, the insulating encapsulant 76' may fill the gaps between the top tier semiconductor dies 20. Furthermore, the insulating encapsulant 76' is in contact with the portions of the bonding dielectric layer 17a of the bottom tier semiconductor die 21 which are not covered by the top tier semiconductor dies 20. In some embodiments, the insulating encapsulant 76' includes a first encapsulation portion 76a and a second encapsulation portion 76b. The first encapsulation portion 76a covers the portions of the bonding dielectric layer 17a of the bottom tier semiconductor die 21 which are not covered by the top tier semiconductor dies 20. The first encapsulation portion 76a fills the gaps between the top tier semiconductor dies 20 and is in contact with sidewalls of the top tier semiconductor dies 20. A thickness of the first encapsulation portion 76a is substantially equal to that of the top tier semiconductor dies 20. The second encapsulation portion 76b laterally encapsulates the SoIC die 22 and the first encapsulation portion 76a. Furthermore, the second encapsulation portion 76b is continuous with the first encapsulation portion 76a and in contact with sidewalls of the bottom tier semiconductor die 21. The second encapsulation portion 76b and the first encapsulation portion 76a may be integrally formed as one-piece encapsulant, and have the same material. A thickness of the second encapsulation portion 76b is substantially equal to an overall thickness of the SoIC die 22 and the die-attachment film 19.

FIG. 2H through 2M illustrate formation of a redistribution circuit structure 77 and solder regions. As shown in FIGS. 2H through 2L, a redistribution circuit structure 77 including a dielectric layer 78, redistribution wirings 80, a dielectric layer 82, redistribution wirings 86, and a dielectric layer 88 is formed on the substrates 12 and the insulating encapsulant 76'. As shown in FIG. 2M, solder regions including Under-Bump Metallurgies (UBMs) 92 and electrical connectors 94 disposed on the UBMs 92 are formed on the redistribution circuit structure 77.

Referring to FIG. 2H, a dielectric layer 78 is formed on the top tier semiconductor dies 20 of the SoIC die 22 and the insulating encapsulant 76'. In some embodiments, the dielectric layer 78 is formed of a polymer such as PBO, polyimide, or the like. In some embodiments, dielectric layer 78 is formed of silicon nitride, silicon oxide, or the like. The openings 79 are formed in the dielectric layer 78 to expose conductive through vias 72 and the through substrate vias 14. The formation of the openings 79 may be performed through a photolithography process.

Next, referring to FIG. 2I, redistribution wirings 80 are formed to connect to the through substrate vias 14 and the conductive through vias 72. The redistribution wirings 80 may also interconnect the through substrate vias 14 and the conductive through vias 72. The redistribution wirings 80 may include metal traces (metal lines) over the dielectric layer 78 as well as metal vias extending into the openings 79 (shown in FIG. 2H) to electrically connect to the conductive through vias 72 and the through substrate vias 14. In some embodiments, the redistribution wirings 80 are formed in a plating process, wherein each of the redistribution wirings 80 includes a seed layer (not shown) and a plated metallic material over the seed layer. The seed layer and the plated material may be formed of the same material or different materials. The redistribution wirings 80 may comprise a metal or a metal alloy including aluminum, copper, tungsten, and alloys thereof. The redistribution wirings 80 are formed of non-solder materials. The via portions of the redistribution wirings 80 may be in physical contact with the top surfaces of the through substrate vias 14.

Referring to FIG. 2J, a dielectric layer 82 is formed over the redistribution wirings 80 and the dielectric layer 78. The dielectric layer 82 may be formed using a polymer, which may be selected from the same candidate materials as those of the dielectric layer 78. For example, the dielectric layer 82 may include PBO, polyimide, BCB, or the like. In some embodiments, the dielectric layer 82 may include non-organic dielectric materials such as silicon oxide, silicon nitride, silicon carbide, silicon oxynitride, or the like. The openings 84 are also formed in the dielectric layer 82 to expose the redistribution wirings 80. The formation of the openings 84 may be performed through a photolithography process.

Referring to FIG. 2K, FIG. 2K illustrates the formation of redistribution wirings 86, which are electrically connected to the redistribution wirings 80. The formation of the redistribution wirings 86 may adopt similar methods and materials to those for forming the redistribution wirings 80.

Referring to FIG. 2L, an additional dielectric layer 88, which may be a polymer layer, is formed to cover the redistribution wirings 86 and the dielectric layer 82. The dielectric layer 88 may be selected from the same candidate polymers used for forming the dielectric layers 78 and 82. Opening(s) 90 are then formed in the dielectric layer 88 to expose the metal pad portions of redistribution wirings 86. The formation of the openings 90 may be performed through a photolithography process.

FIG. 2M illustrates the formation of the UBMs 92 and the electrical connectors 94 in accordance with some exemplary embodiments. Referring to FIG. 2M, the formation of the UBMs 92 may include deposition and patterning. The formation of the electrical connectors 94 may include placing solder on the exposed portions of the UBMs 92 and then reflowing the solder to form solder balls. In some embodiments, the formation of the electrical connectors 94 includes performing a plating step to form solder regions over redistribution wirings 86 and then reflowing the solder regions. The electrical connectors 94 may also include metal pillars or metal posts and solder caps, which may also be formed through plating. Throughout the description, the combined structure including the SoIC die 22, the conductive through vias 72, the insulating encapsulant 76', the redistribution circuit structures 61 and the redistribution circuit structures 77 will be referred to as a package 100, which may be a composite wafer with a round top-view shape.

Next, the package 100 is de-bonded from carrier 60. The de-bonding layer 62 is also cleaned from the package 100. The de-bonding may be performed by irradiating a light such as UV light or laser on the de-bonding layer 62 to decompose the de-bonding layer 62. In the de-bonding process, a tape (not shown) may be adhered onto the dielectric layer 88 and the electrical connectors 94. In subsequent steps, the carrier 60 and the de-bonding layer 62 are removed from the package 100. A die saw process is performed to saw the package 100 into multiple Integrated Fan-out (InFO) packages, each including at least one SoIC die 22, conductive through vias 72, an insulating encapsulant 76', a redistribution circuit structures 61, and a redistribution circuit structures 77. One of the resulting packages is shown as a package 100 illustrated in FIG. 2N.

FIG. 2N illustrates a package on package (PoP) structure in accordance with some embodiments of the present disclosure. Referring to FIG. 2N, another package 200 is provided and bonded with the package 102 such that a PoP structure is formed. In some embodiments of the present disclosure, the bonding between the package 200 and the package 102 is performed through solder regions 98, which joins the metal pad portions of the redistribution wirings 66 to the metal pads in the package 200. In some embodiments, the package 200 includes device dies 202, which may be memory dies such as Static Random Access Memory (SRAM) dies, Dynamic Random Access Memory (DRAM) dies, or the like. The memory dies may also be bonded to package substrate 204 in some exemplary embodiments.

Figure 3A:
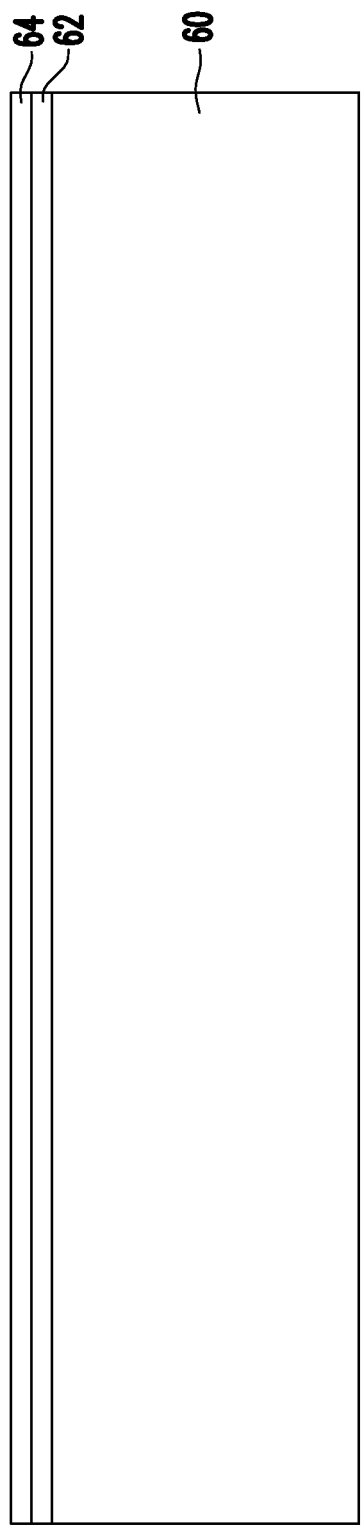
FIGS. 3A through 3N are cross-sectional views schematically illustrating a process flow for fabricating integrated fan-out package structures in accordance with some other embodiments of the present disclosure.
Figure 3B:
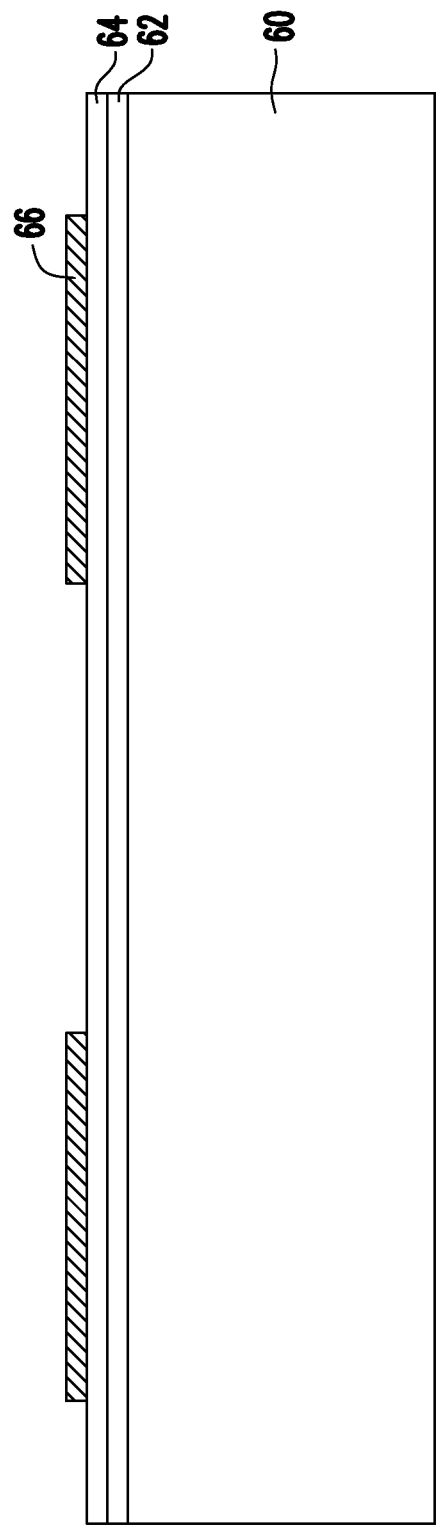
Figure 3C:
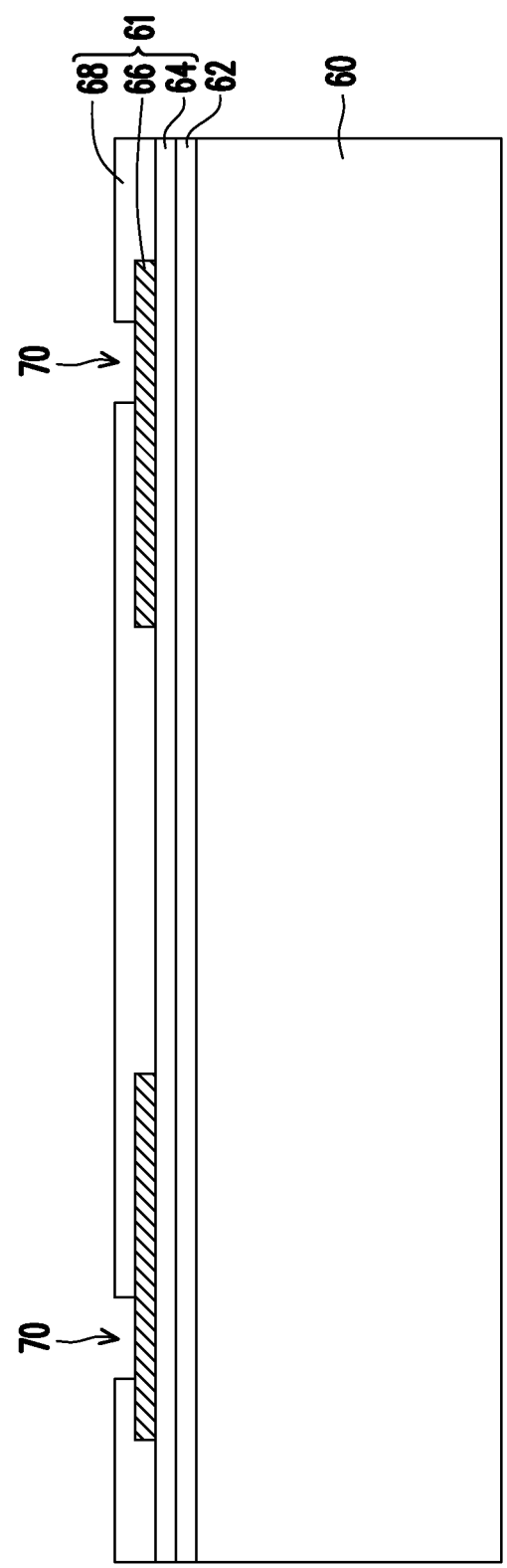
Figure 3D:
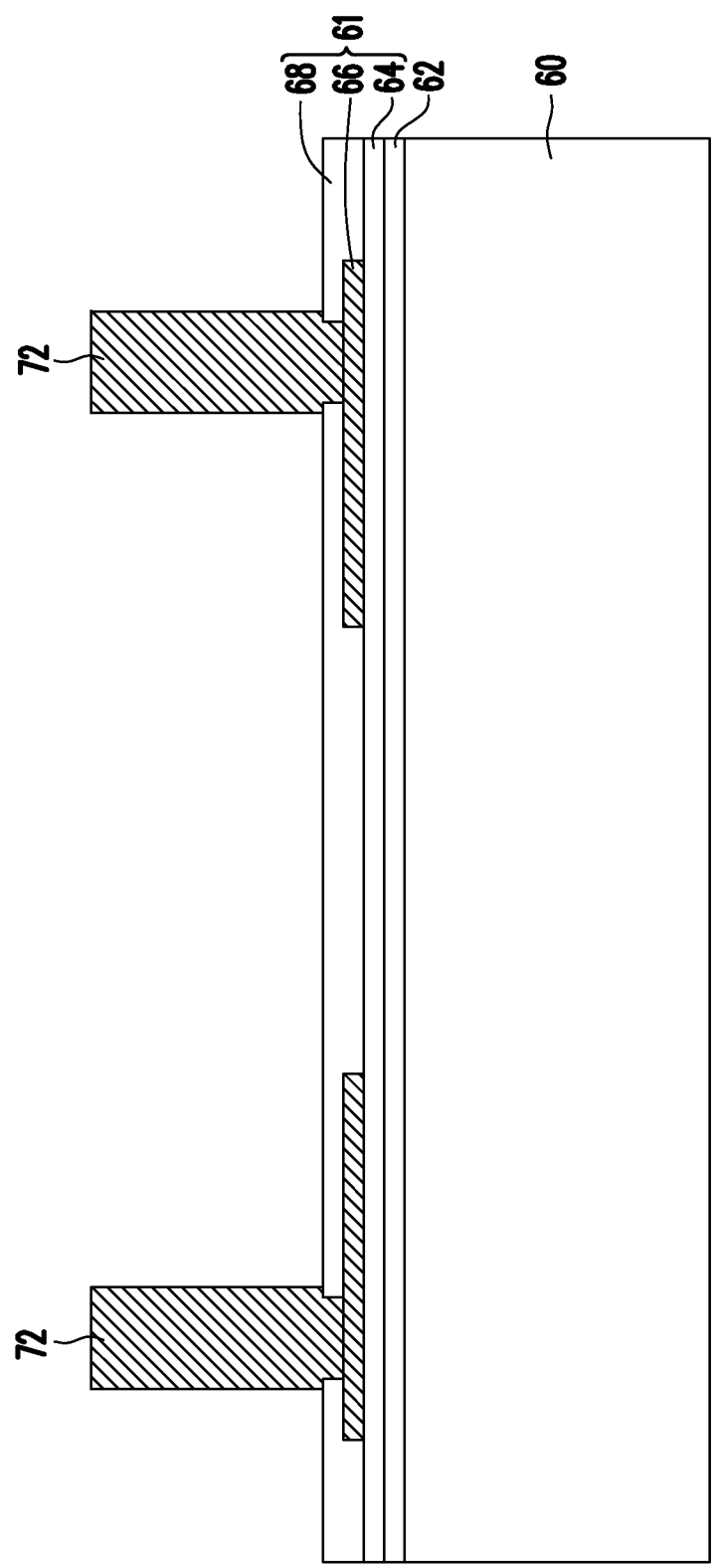
Figure 3E:
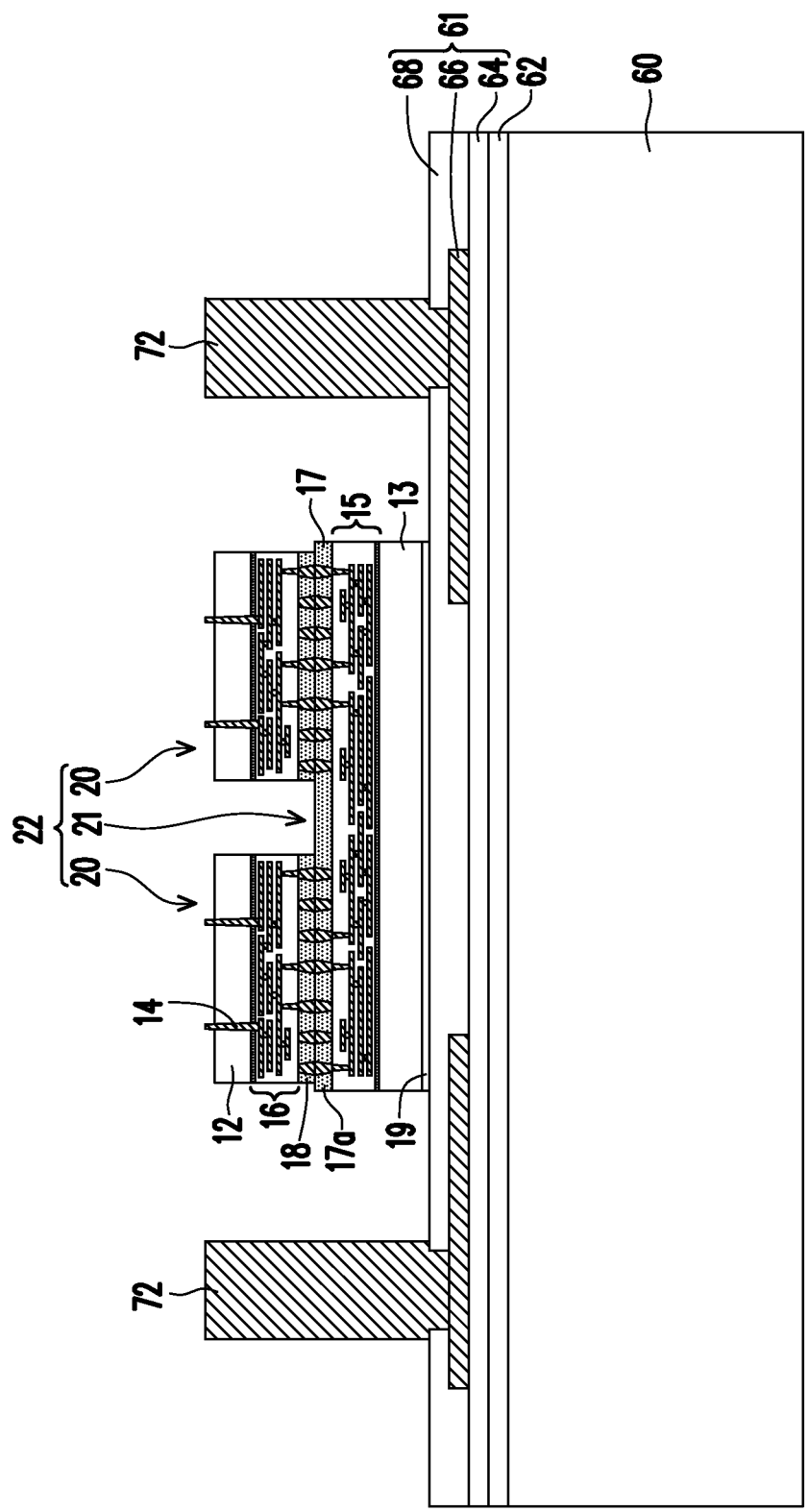
Figure 3F:
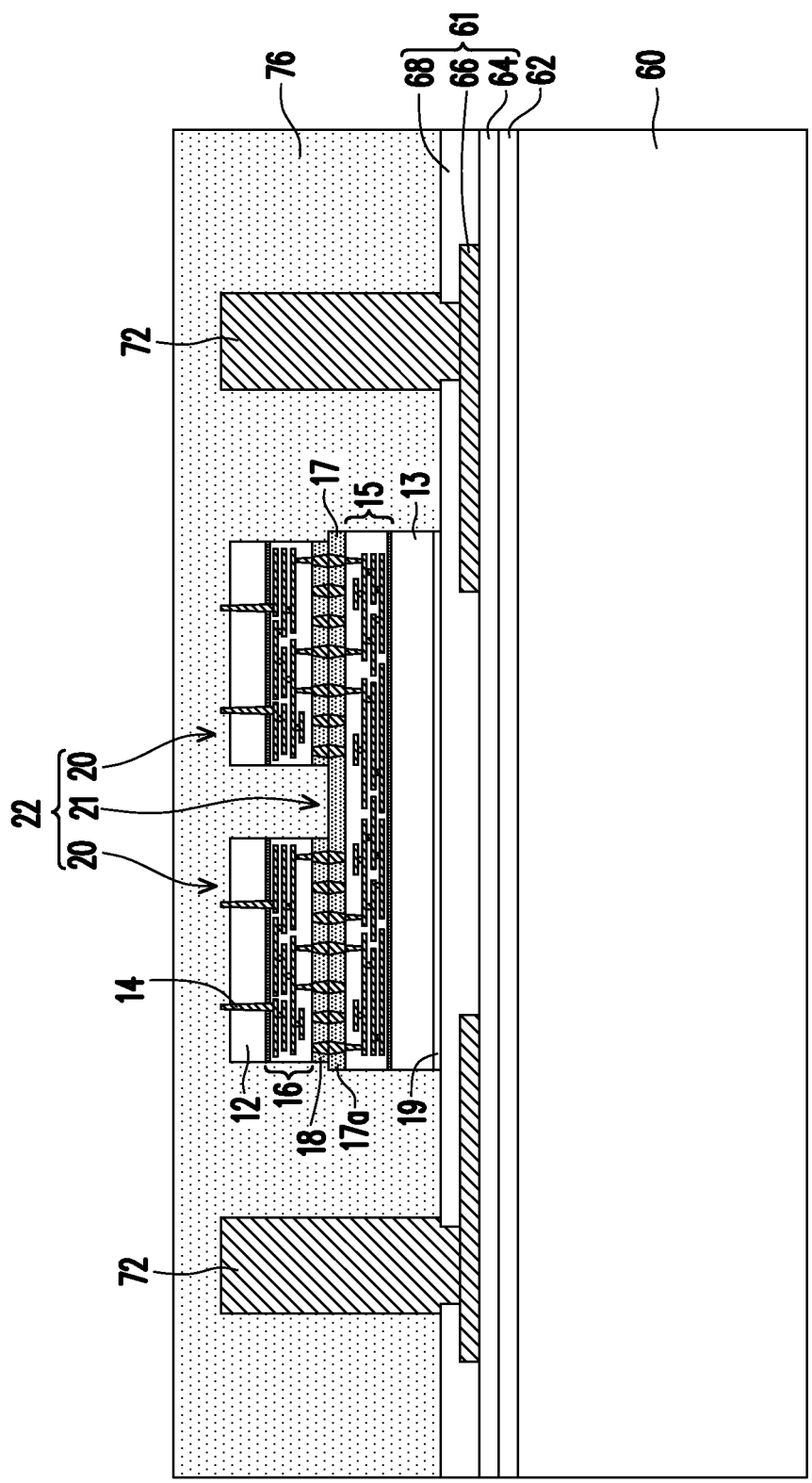
Figure 3G:
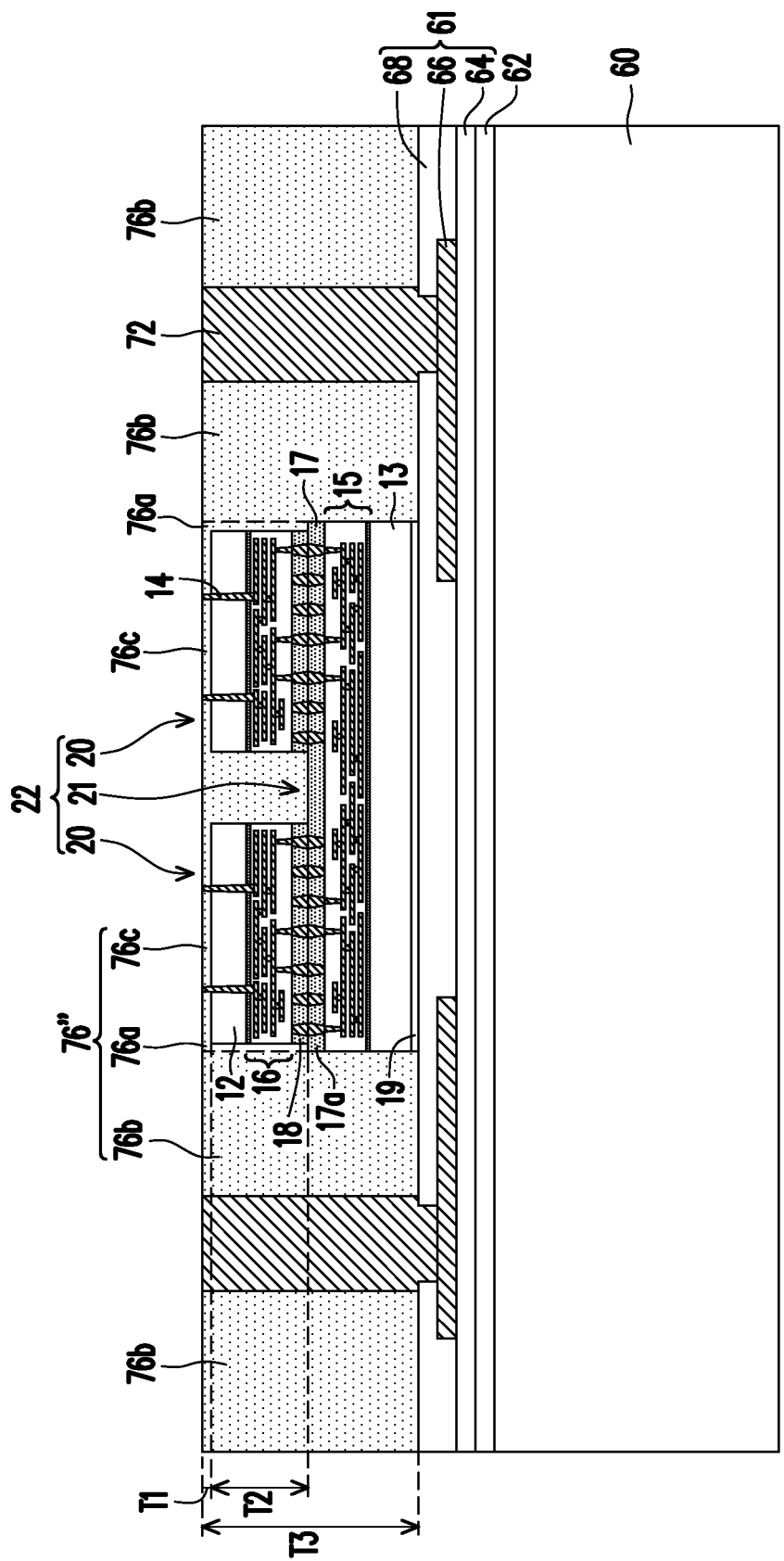
Figure 3H:
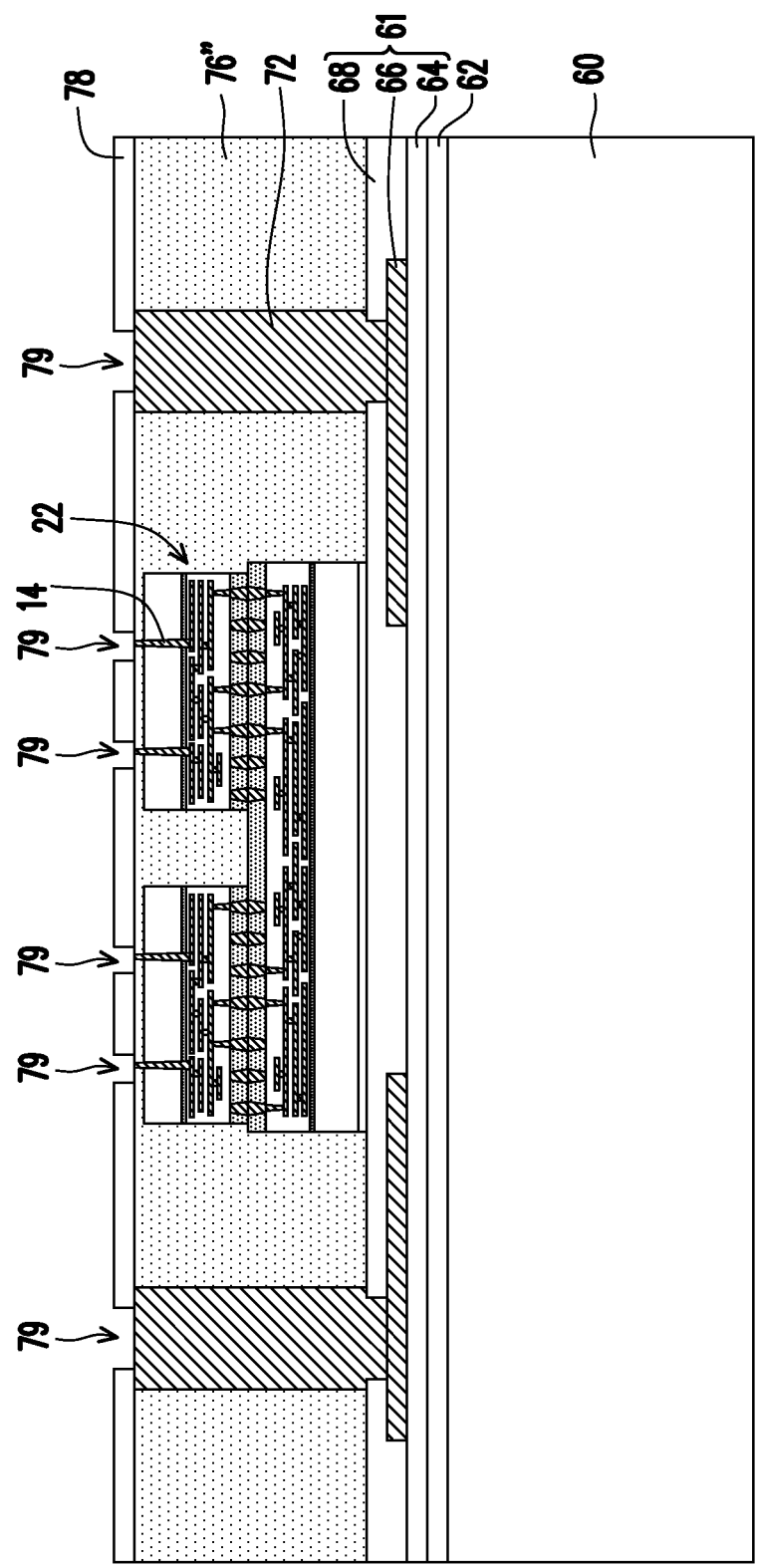
Figure 31:
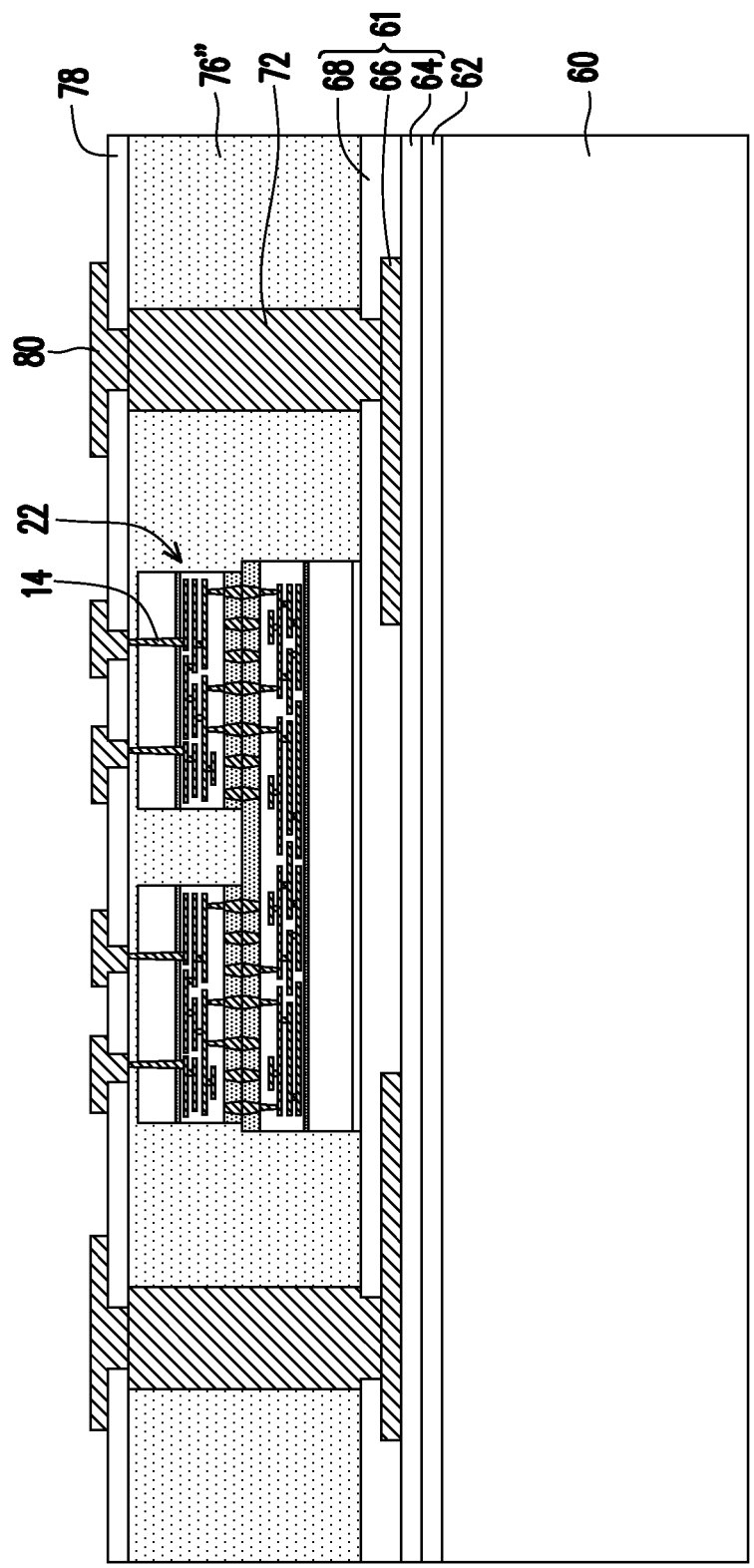
Figure 3J:
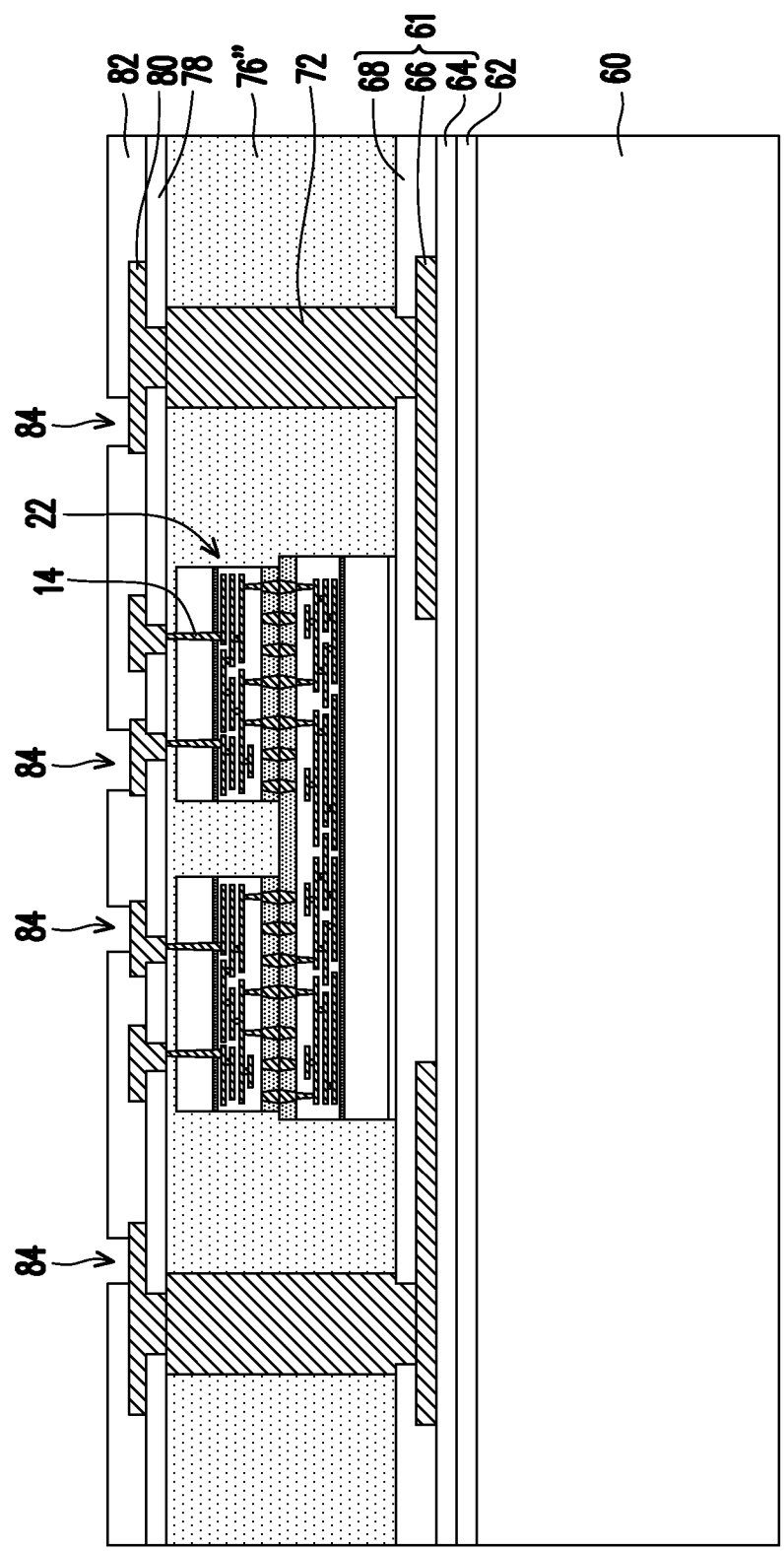
Figure 3K:
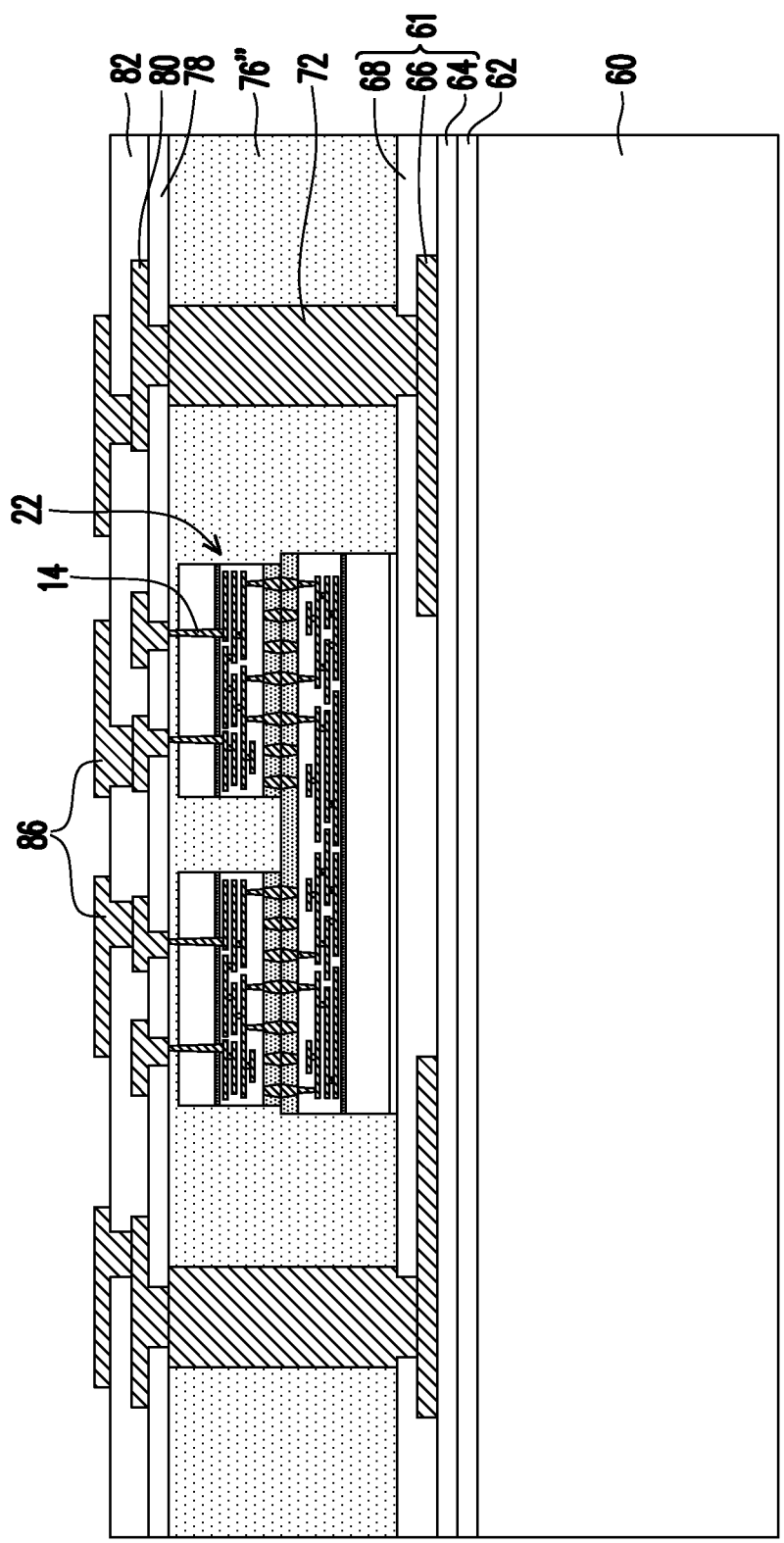
Figure 3L:
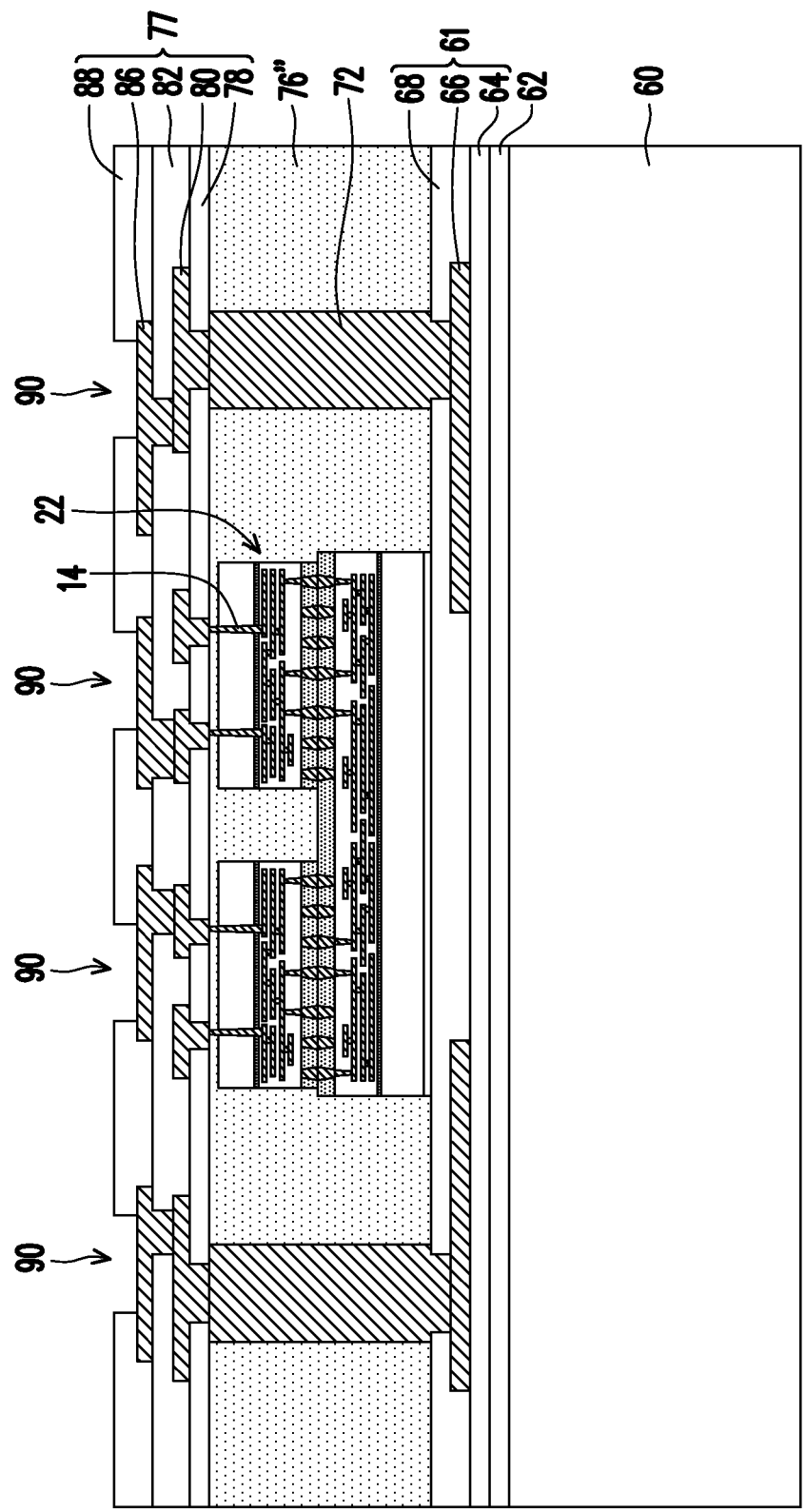
Figure 3M:
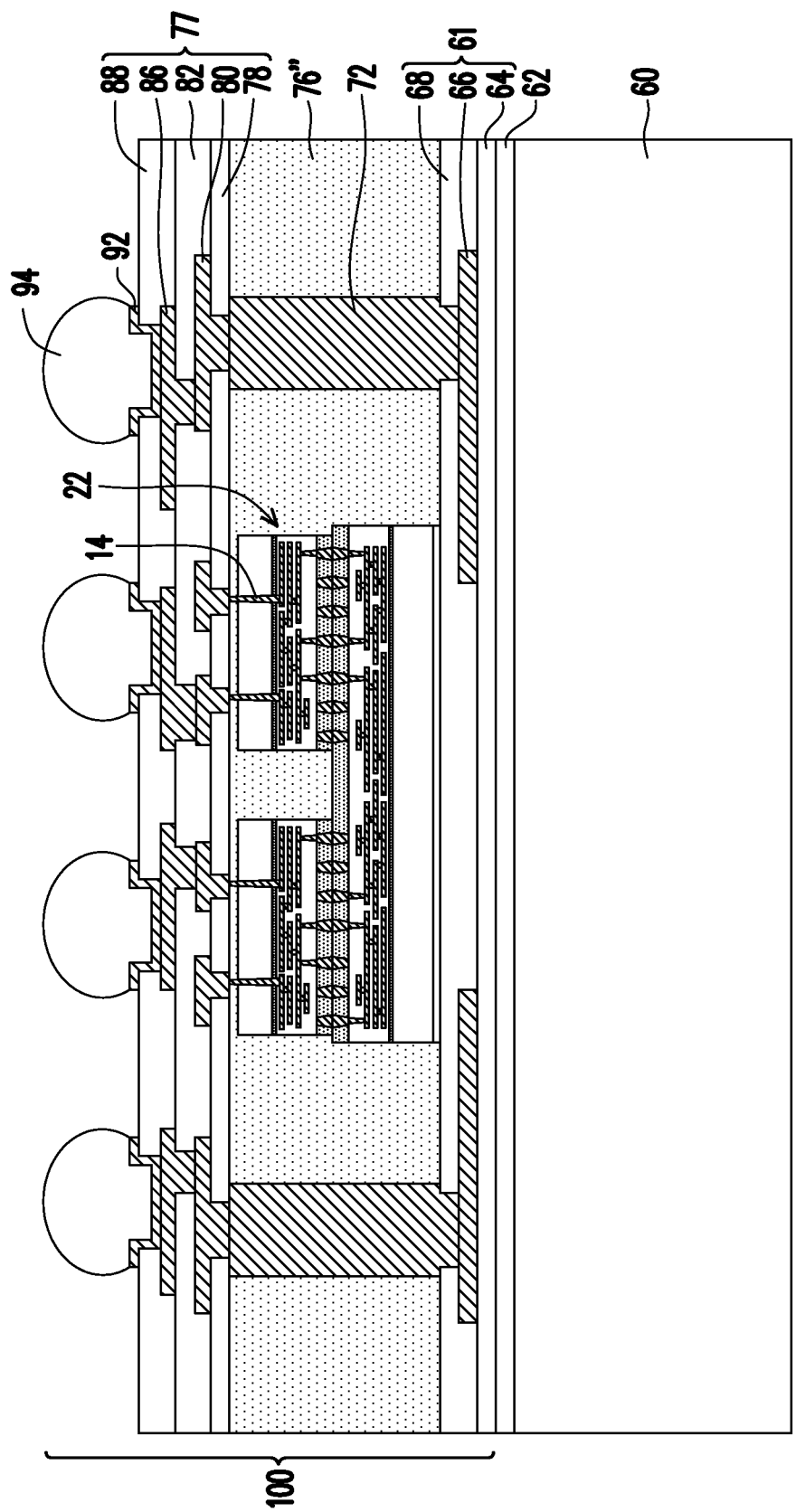
Figure 3N:
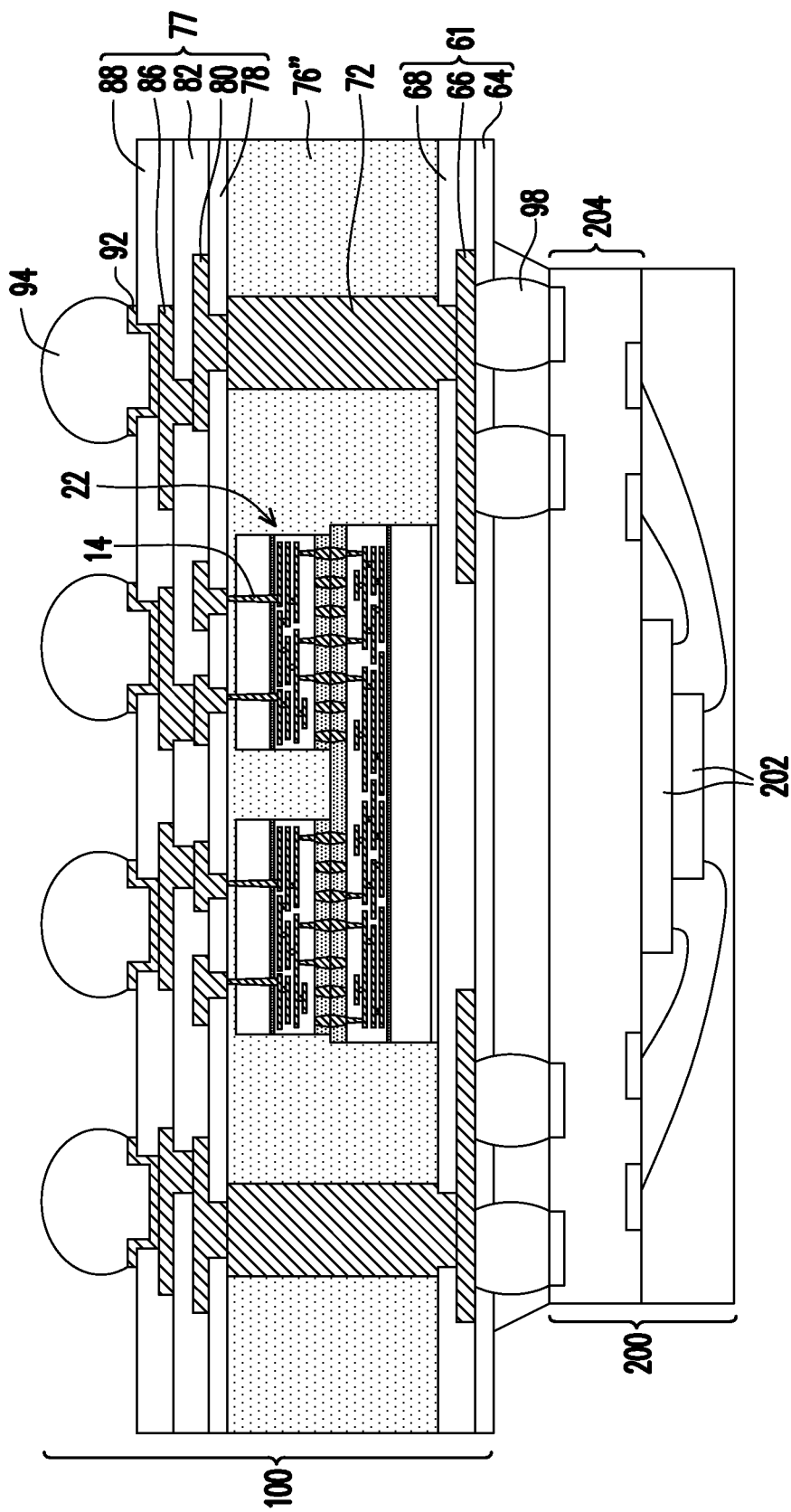

FIGS. 3A through 3N are cross-sectional views schematically illustrating a process flow for fabricating integrated fan-out package structures of SoIC dies in accordance with some embodiments of the present disclosure.

Referring to FIGS. 3A through 3D, since the processes illustrated in FIGS. 3A through 3D are the same as those illustrated in FIGS. 2A through 2D, detailed descriptions regarding to FIGS. 3A through 3D are thus omitted.

Referring FIG. 3E, after forming the conductive through vias 72, at least one singulated SoIC die 22 shown in FIG. 1D is picked-up and placed over the dielectric layer 68 of the redistribution circuit structure 61. Only a single singulated SoIC die 22 and its surrounding conductive through vias 72 are illustrated in FIG. 3E for illustrative purposes. It is noted, however, that the process steps shown in FIGS. 3A through 3N may be performed on a plurality regions at a wafer level, and may be performed on all of the singulated SoIC dies 22 and the conductive through vias 72 disposed over the carrier 60 in some embodiments. As illustrated in FIG. 3E, the top tier semiconductor dies 20 are stacked over the bottom tier semiconductor die 21, and the back surface of the bottom tier semiconductor die 21 in the singulated SoIC die 22 is adhered to the dielectric layer 68 through the die-attachment film 19. In some embodiments, the die-attachment film 19 is an adhesive film (e.g., epoxy film, silicone film, and so on).

After the singulated SoIC die 22 is mounted over the dielectric layer 68, a removal process is performed to partially remove the substrates 12 of the top tier semiconductor dies 20 until the through substrate vias 14 protrude from the back surfaces of the substrates 12. In some embodiments, the substrates 12 are silicon substrates, a silicon recessing process is performed to partially remove (e.g., thin down) the substrates 12, wherein an isotropic etch process is utilized to partially remove the substrates 12 such that the through substrate vias 14 protrude from the back surfaces of the substrates 12, and an etchant used to etch the substrates 12 includes sulfur hexafluoride ($SF_6$) or other suitable etchant. Level height difference between the top ends of the through substrate vias 14 and the back surfaces of the substrates 12 may be in a range from about 1 micrometer to about 2 micrometers.

Referring to FIG. 3F, an insulating encapsulation material 76 is formed over the redistribution circuit structure 61 to cover the SoIC die 22 and the conductive through vias 72. The insulating encapsulation material 76 may be a molding compound (e.g., epoxy or other suitable resin) formed through an over-molding process. The insulating encapsulation material 76 fills the gaps between neighboring conductive through vias 72, the gaps between the top tier semiconductor dies 20, and the gaps between the conductive through vias 72 and the SoIC die 22. The top surface of the insulating encapsulation material 76 is higher than the top ends of the through substrate vias 14, the back surface of the top tier semiconductor dies 20 and the conductive through vias 72.

Next, as shown in FIG. 3G, a planarization such as a Chemical Mechanical Polish (CMP) process and/or a mechanical grinding process is performed to partially remove the insulating encapsulation material 76 until the conductive through vias 72 and the through substrate vias 14 protruding from the back surface of the top tier semiconductor dies 20 are exposed. After the insulating encapsulation material 76 is thinned down, an insulating encapsulant 76" is formed to laterally encapsulate the SoIC die 22 and the conductive through vias 72. Due to the planarization, the top ends of conductive through vias 72 and the top ends of the through substrate vias 14 are substantially level or coplanar with the top surface of the insulating encapsulant 76", within process variations. In the illustrated exemplary embodiments, the planarization is performed until the conductive through vias 72 and the through substrate vias 14 protruding from the top tier semiconductor dies 20 are exposed.

As shown in FIG. 3G, the insulating encapsulant 76" may fill the gaps between the top tier semiconductor dies 20. The insulating encapsulant 76" covers the back surface of the top tier semiconductor dies 20. Furthermore, the insulating encapsulant 76" is in contact with the portions of the bonding dielectric layer 17a of the bottom tier semiconductor die 21 which are not covered by the top tier semiconductor dies 20. In some embodiments, the insulating encapsulant 76" includes a first encapsulation portion 76a, a second encapsulation portion 76b, and a third encapsulation portion 76c. The first encapsulation portion 76a covers the portions of the bonding dielectric layer 17a of the bottom tier semiconductor die 21 which are not covered by the top tier semiconductor dies 20. The first encapsulation portion 76a fills the gaps between the top tier semiconductor dies 20 and is in contact with sidewalls of the top tier semiconductor dies 20. The thickness T1 of the first encapsulation portion 76a is substantially equal to that of the top tier semiconductor dies 20. The second encapsulation portion 76b laterally encapsulates the SoIC die 22 and the first encapsulation portion 76a. The second encapsulation portion 76b is continuous with the first encapsulation portion 76a and in contact with sidewalls of the bottom tier semiconductor die 21. The thickness T2 of the second encapsulation portion 76b is substantially equal to an overall thickness of the SoIC die 22 and the die-attachment film 19. Furthermore, the third encapsulation portion 76c covers the back surfaces of the top tier semiconductor dies 20 and laterally encapsulates the through substrate vias 14 protruding from the back surfaces of the top tier semiconductor dies 20. In other words, the through substrate vias 14 protruding from the back surfaces of the top tier semiconductor dies 20 penetrate through the third encapsulation portion 76c. The third encapsulation portion 76c is laterally surrounded by and continuous with the first encapsulation portion 76a. The thickness T3 of the third encapsulation portion 76c may range from about 1 micrometer to about 2 micrometers. It is noted that, the substrates 12 of the top tier semiconductor dies 20 are still covered by the third encapsulation portion 76c and not revealed at this stage.

FIG. 3H through 3M illustrate formation of a redistribution circuit structure 77 and solder regions. As shown in FIGS. 3H through 3L, a redistribution circuit structure 77 including a dielectric layer 78, redistribution wirings 80, a dielectric layer 82, redistribution wirings 86, and a dielectric layer 88 is formed on the top ends of conductive through vias 72, the top ends of the through substrate vias 14, and the insulating encapsulant 76". The redistribution circuit structure 77 is spaced apart from the substrates 12 by the insulating encapsulant 76". As shown in FIG. 3M, solder regions including Under-Bump Metallurgies (UBMs) 92 and electrical connectors 94 disposed on the UBMs 92 are formed on the redistribution circuit structure 77.

Referring to FIGS. 3H through 3N, similar processes and materials may be used as those discussed above with reference to FIGS. 2H through 2N.

Figure 4A:
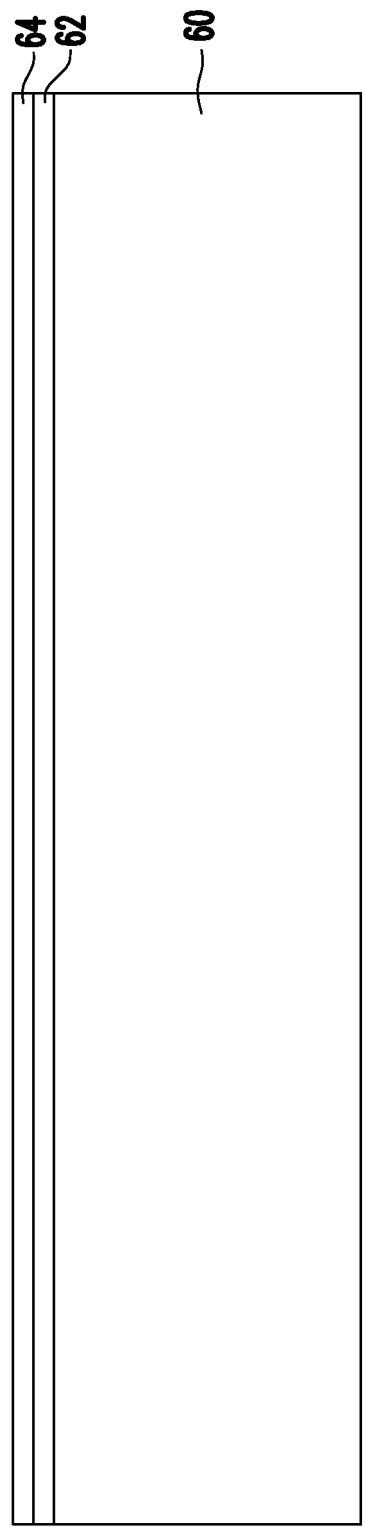
FIGS. 4A through 4N are cross-sectional views schematically illustrating a process flow for fabricating integrated fan-out package structures in accordance with some alternative embodiments of the present disclosure.
Figure 4B:
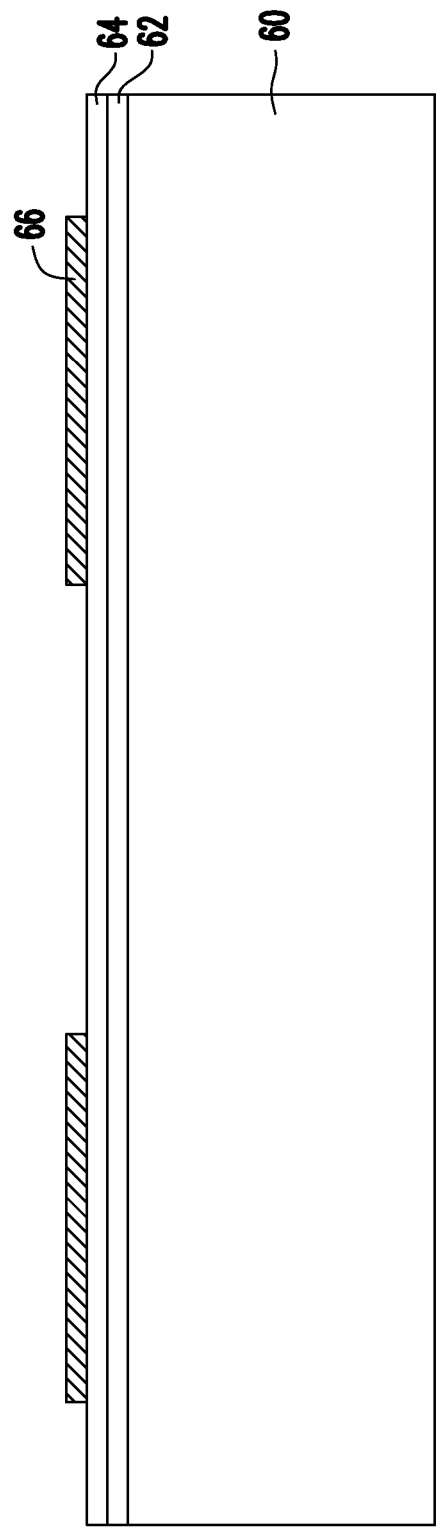
Figure 4C:
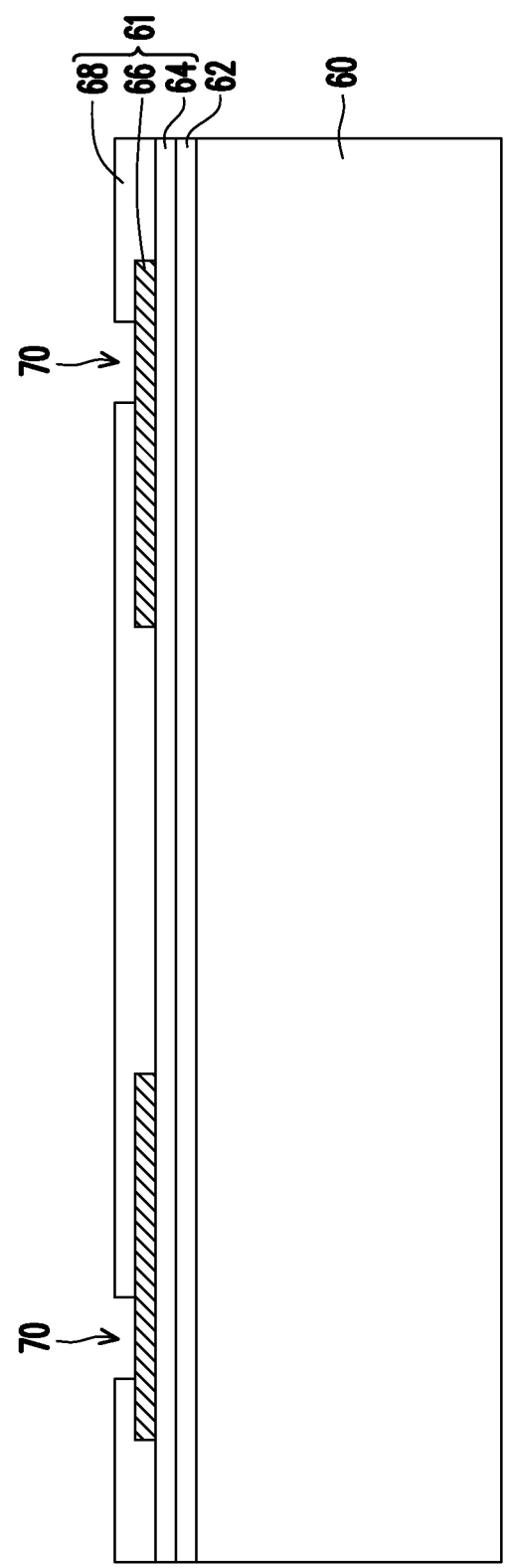
Figure 4D:
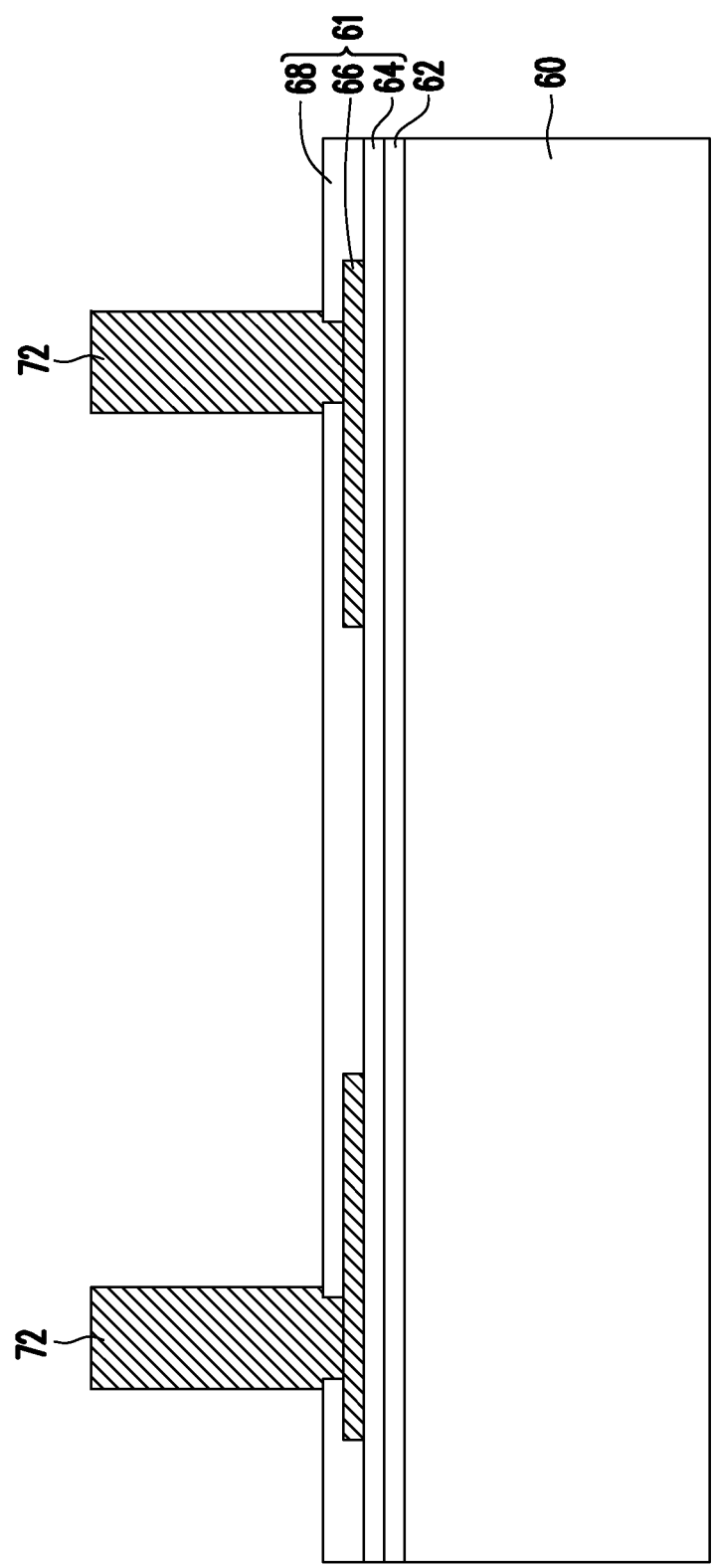
Figure 4E:
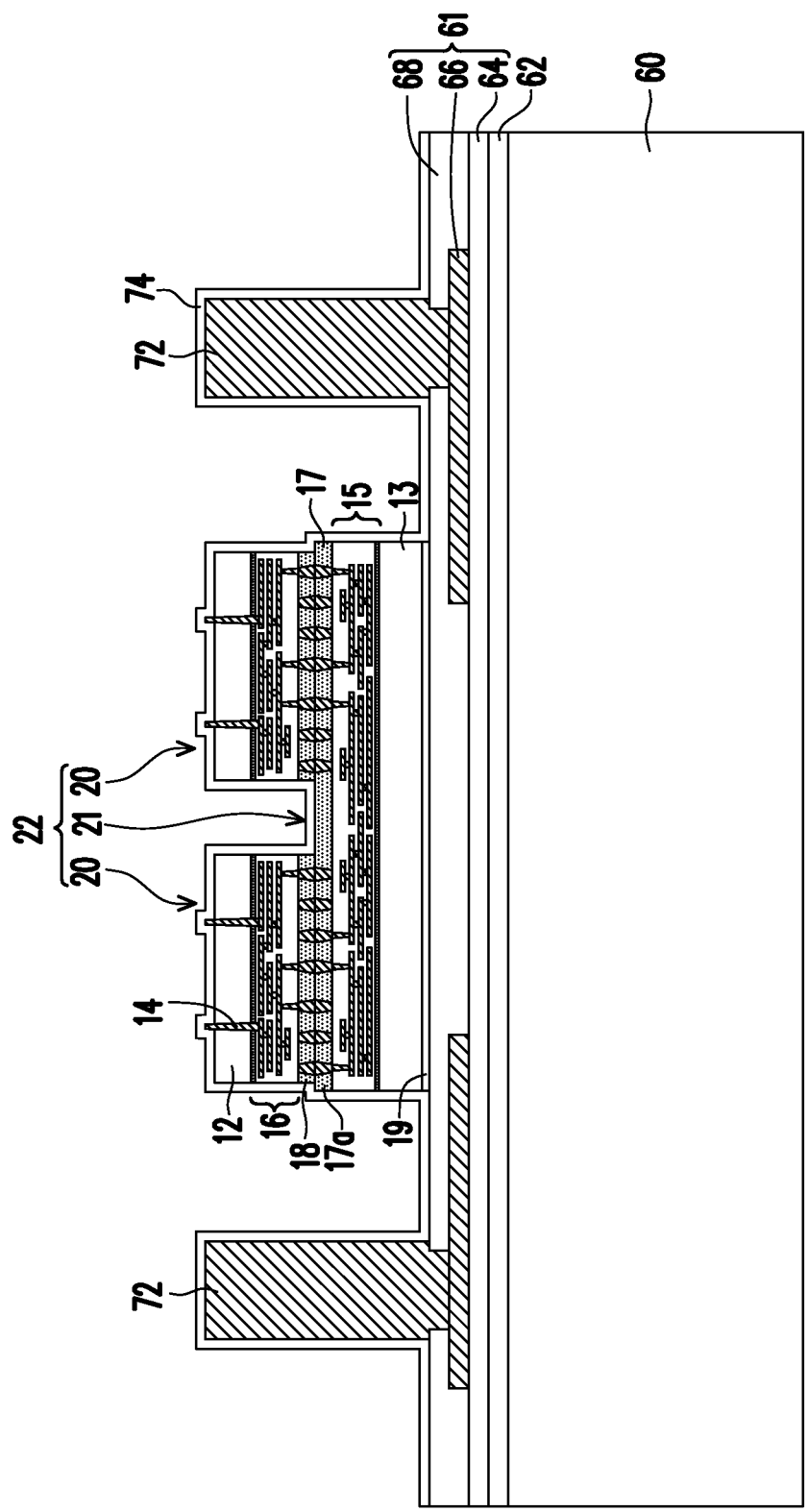
Figure 4F:
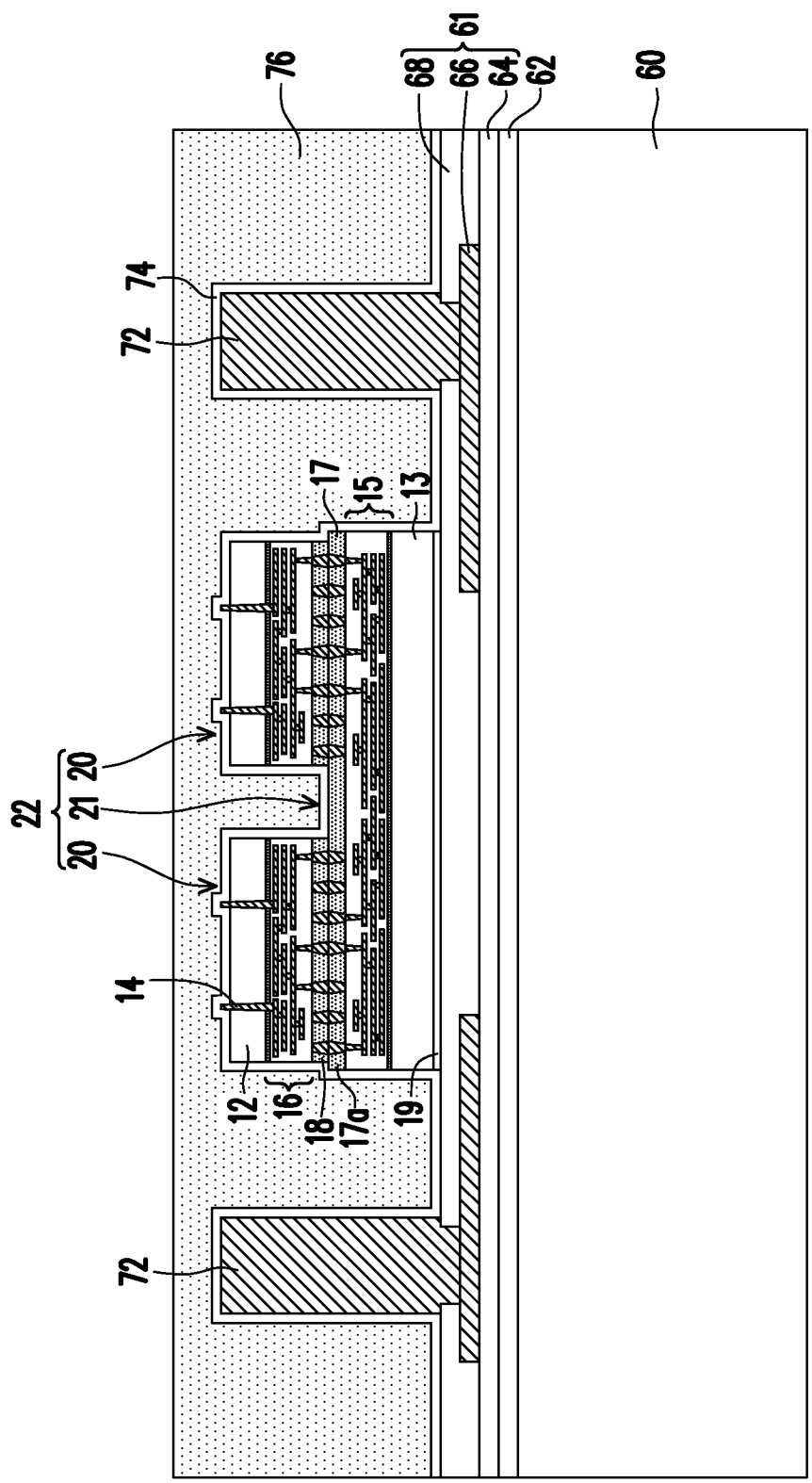
Figure 4G:
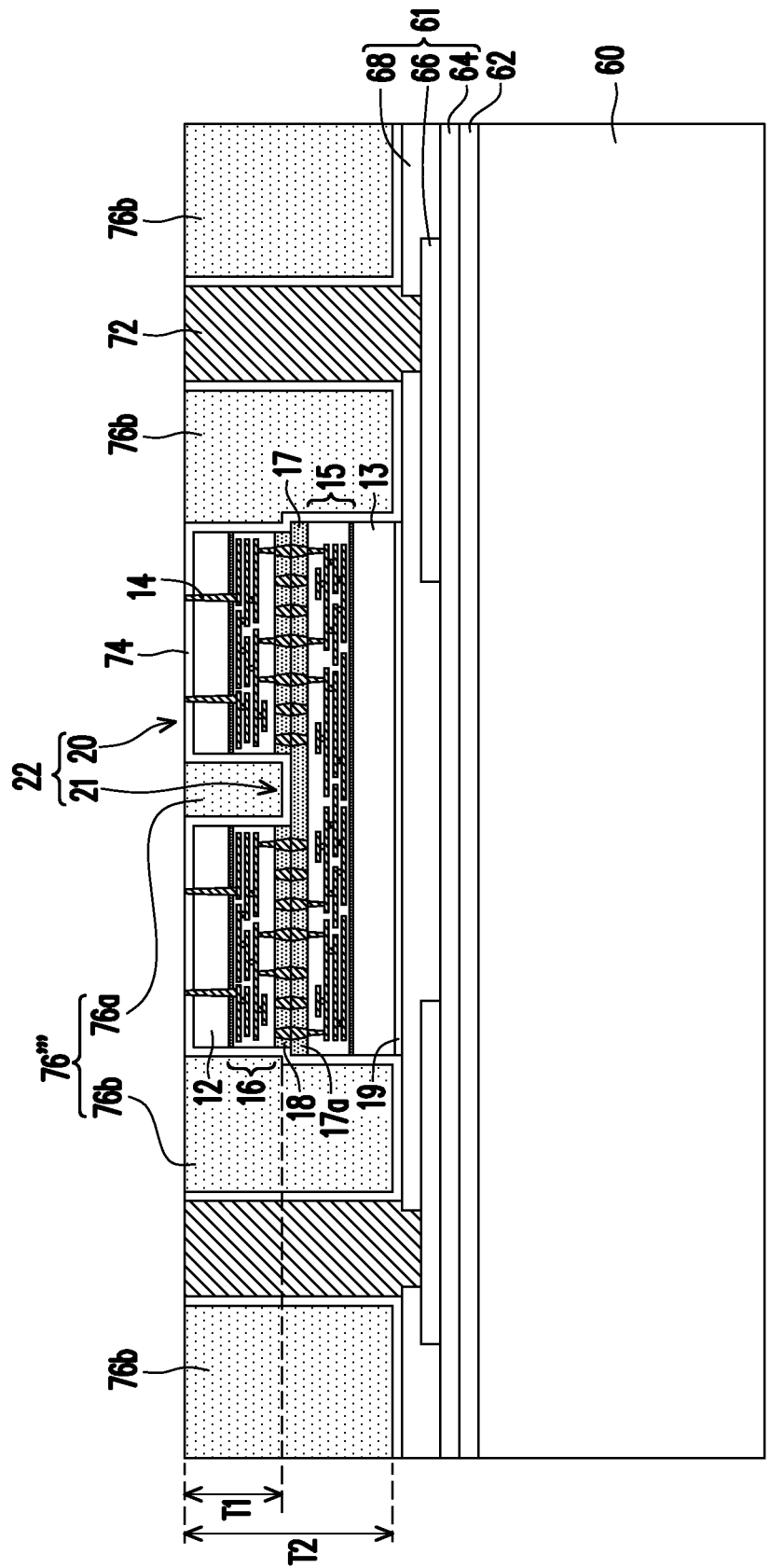
Figure 4H:
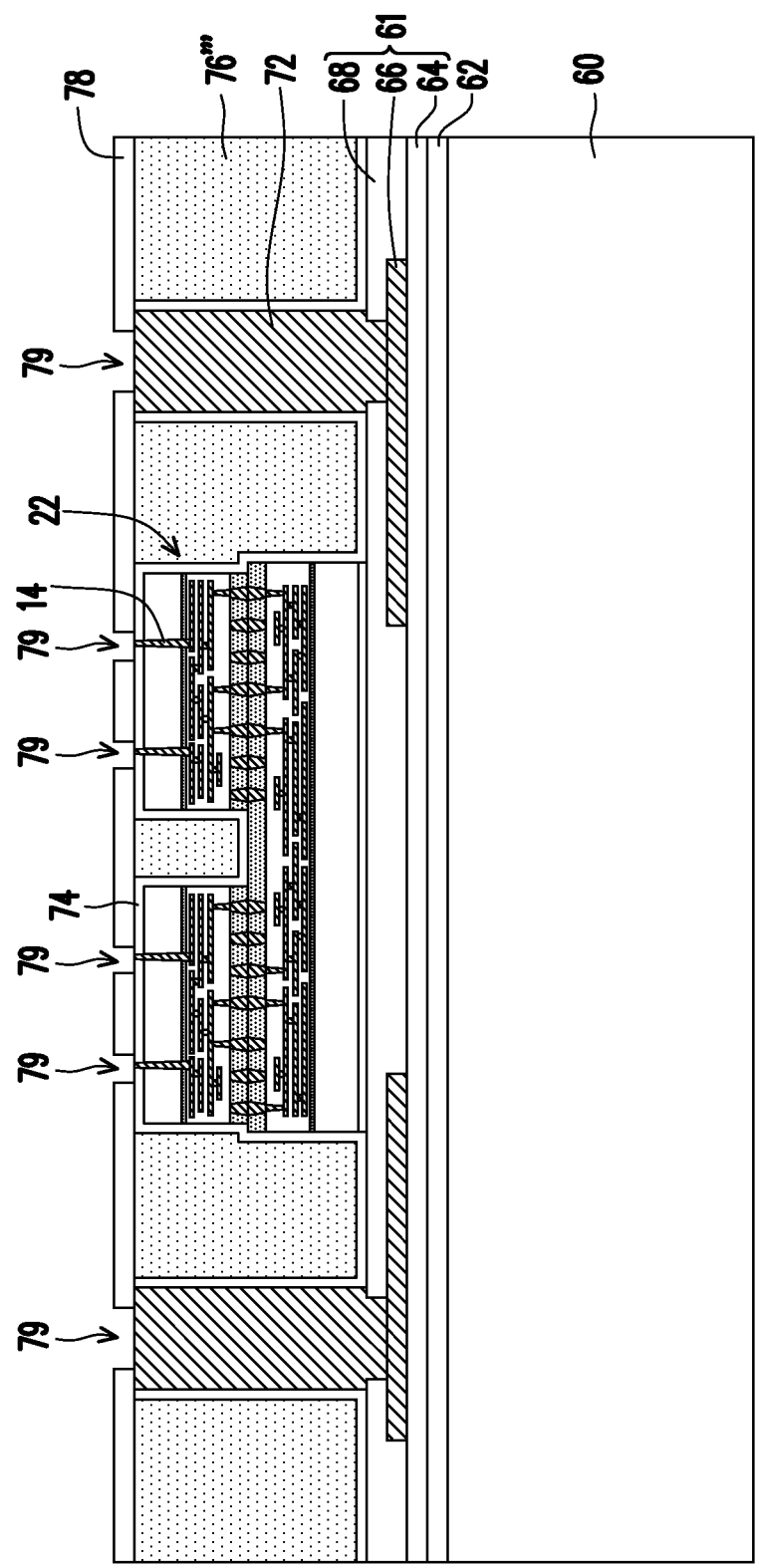
Figure 41:
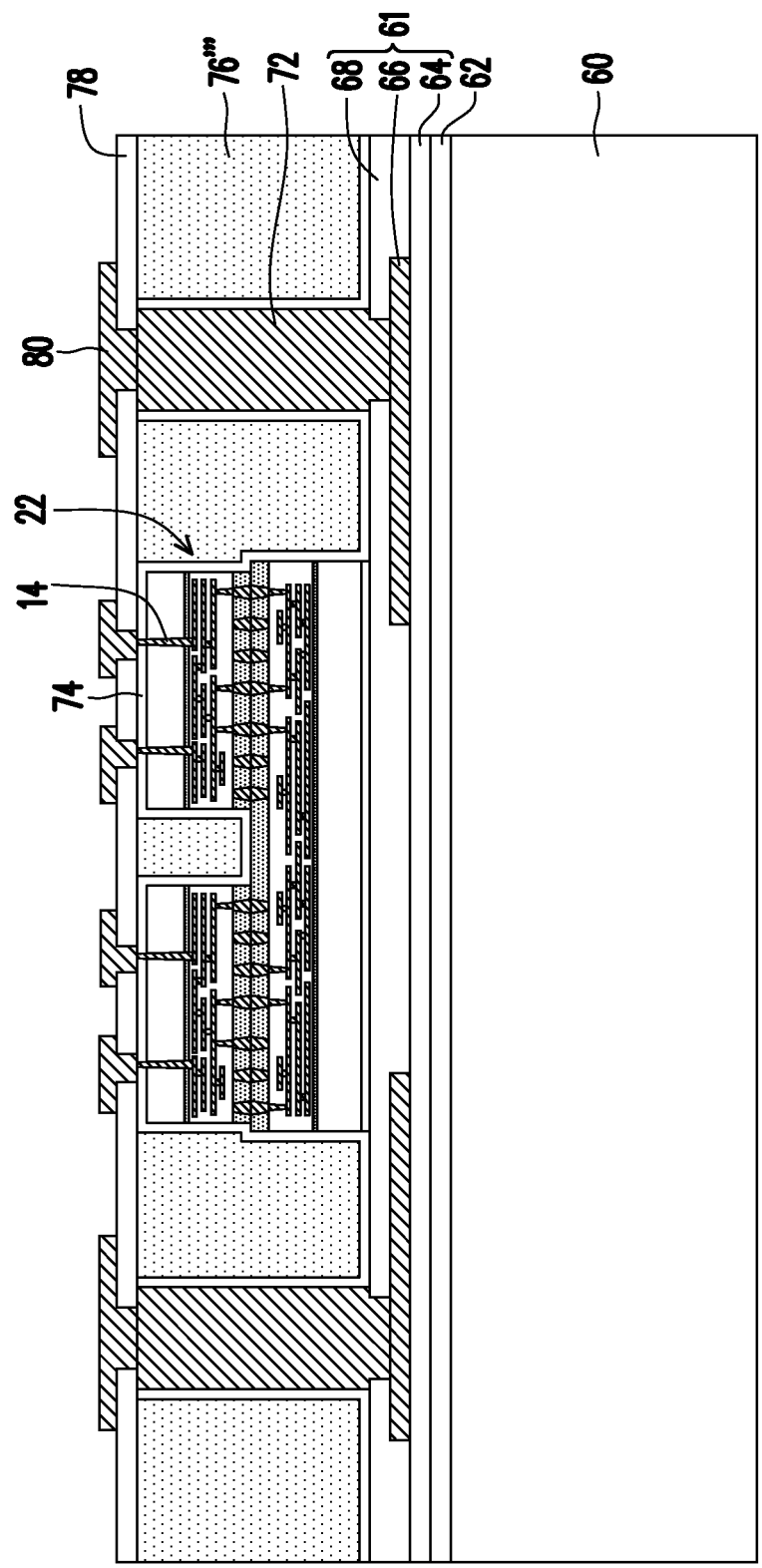
Figure 4J:
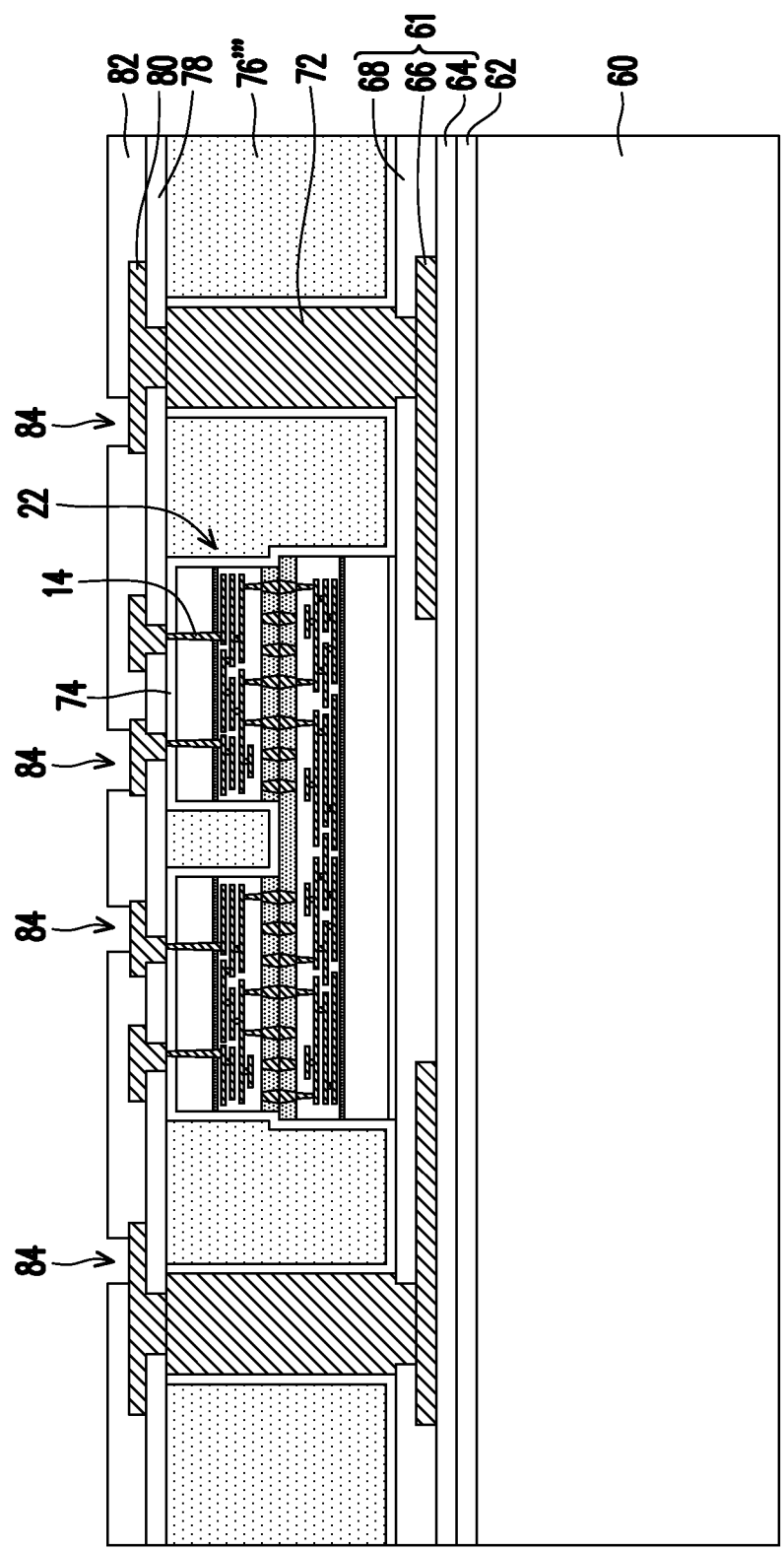
Figure 4K:
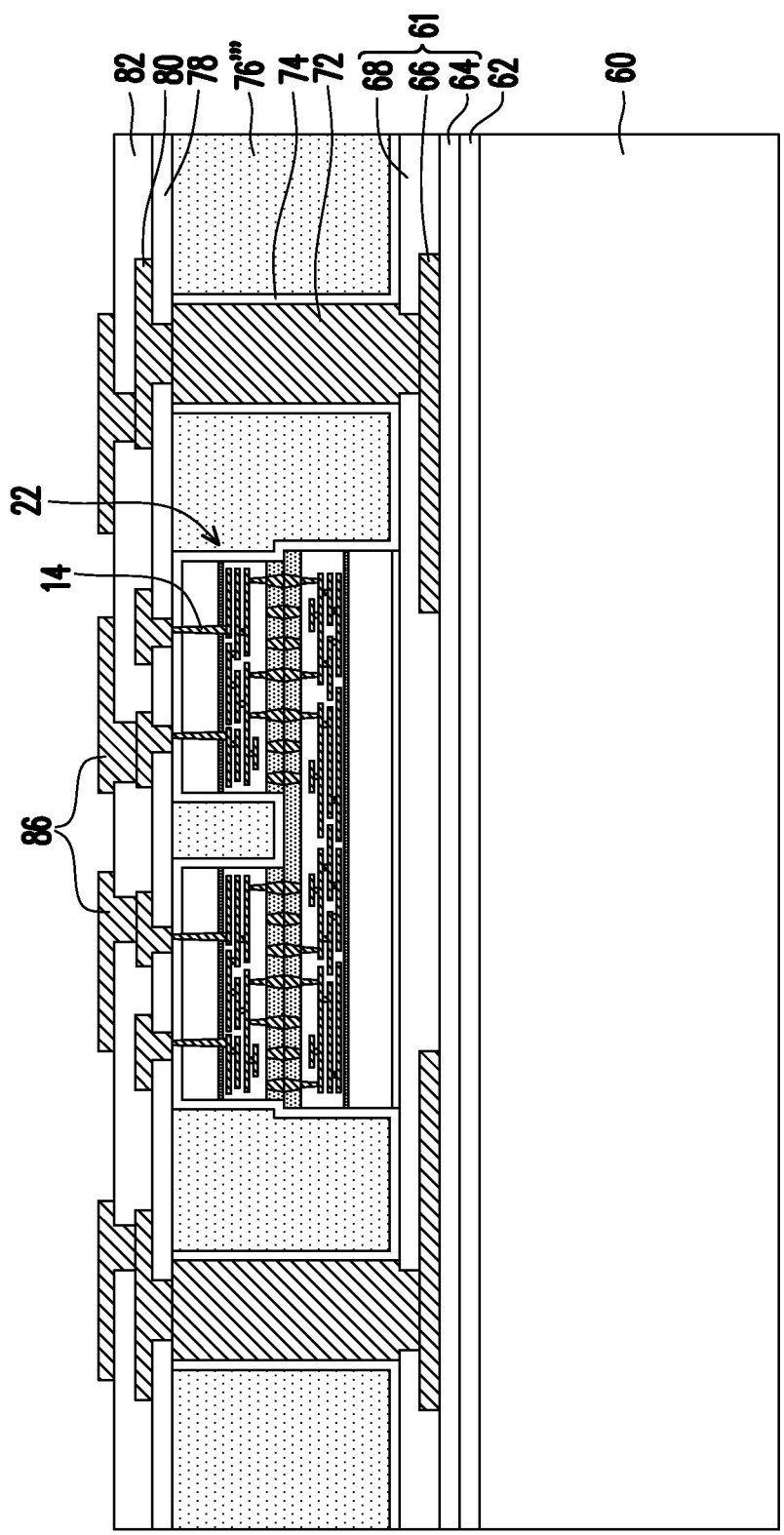
Figure 4L:
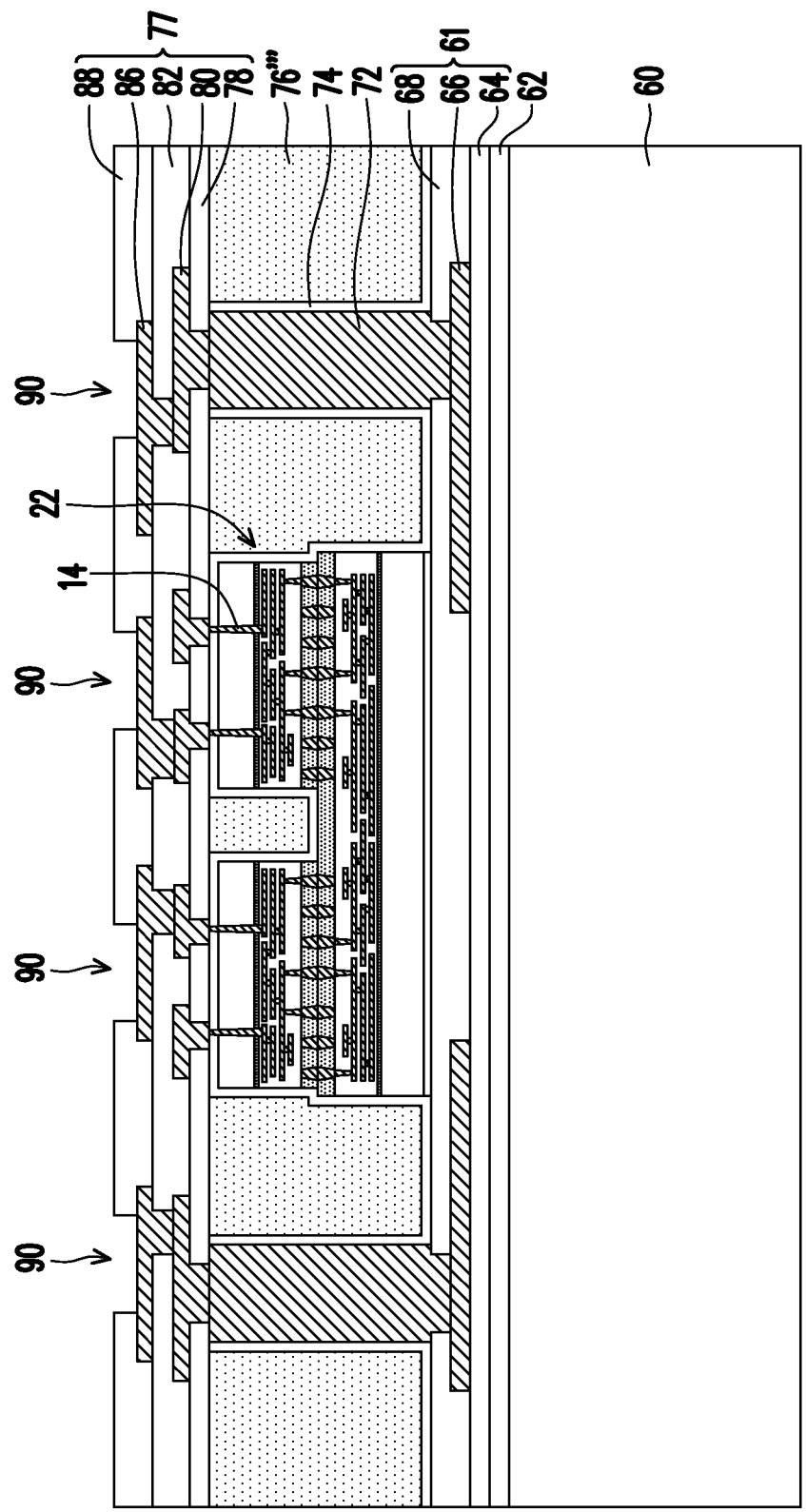
Figure 4M:
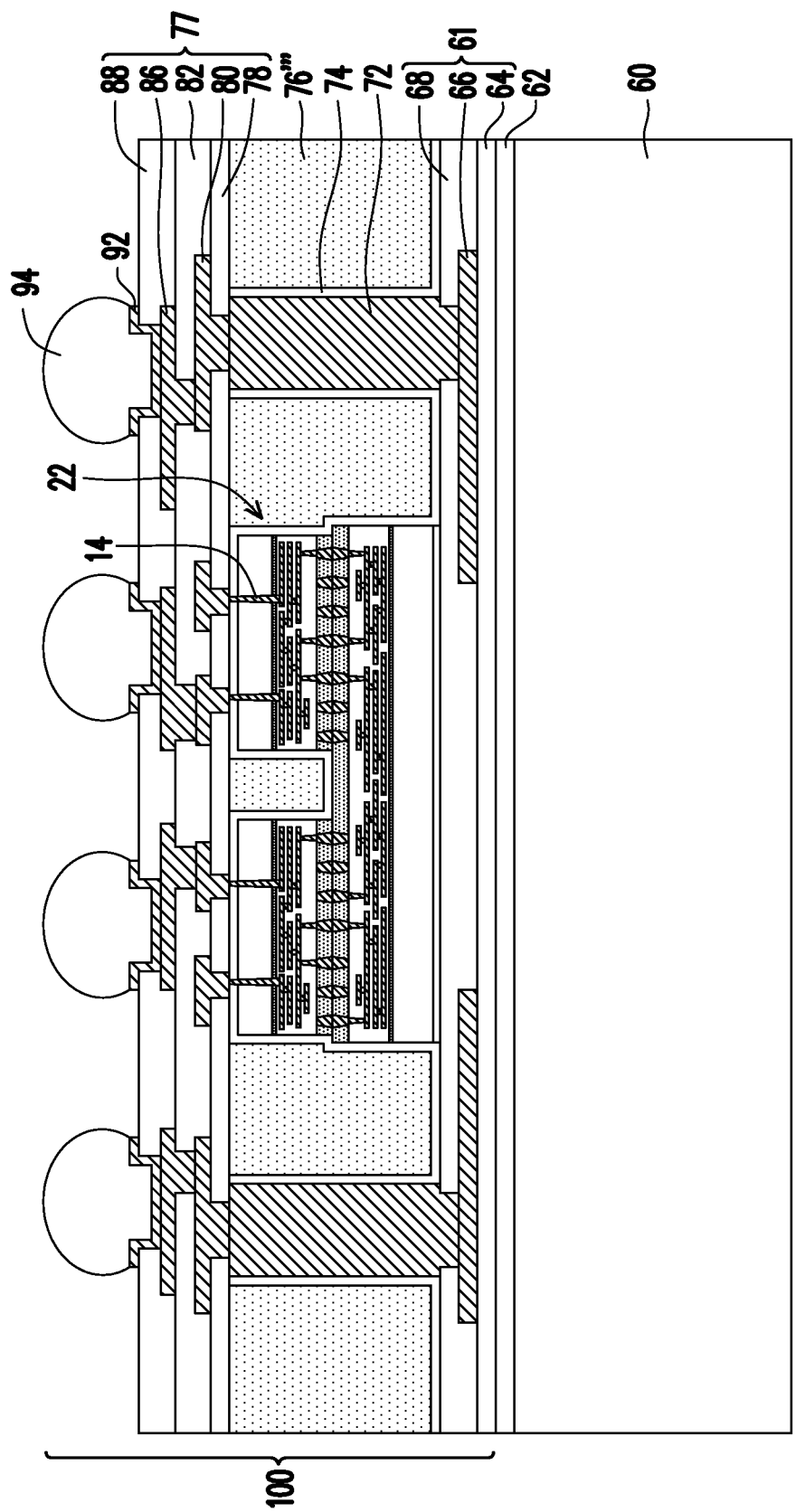
Figure 4N:
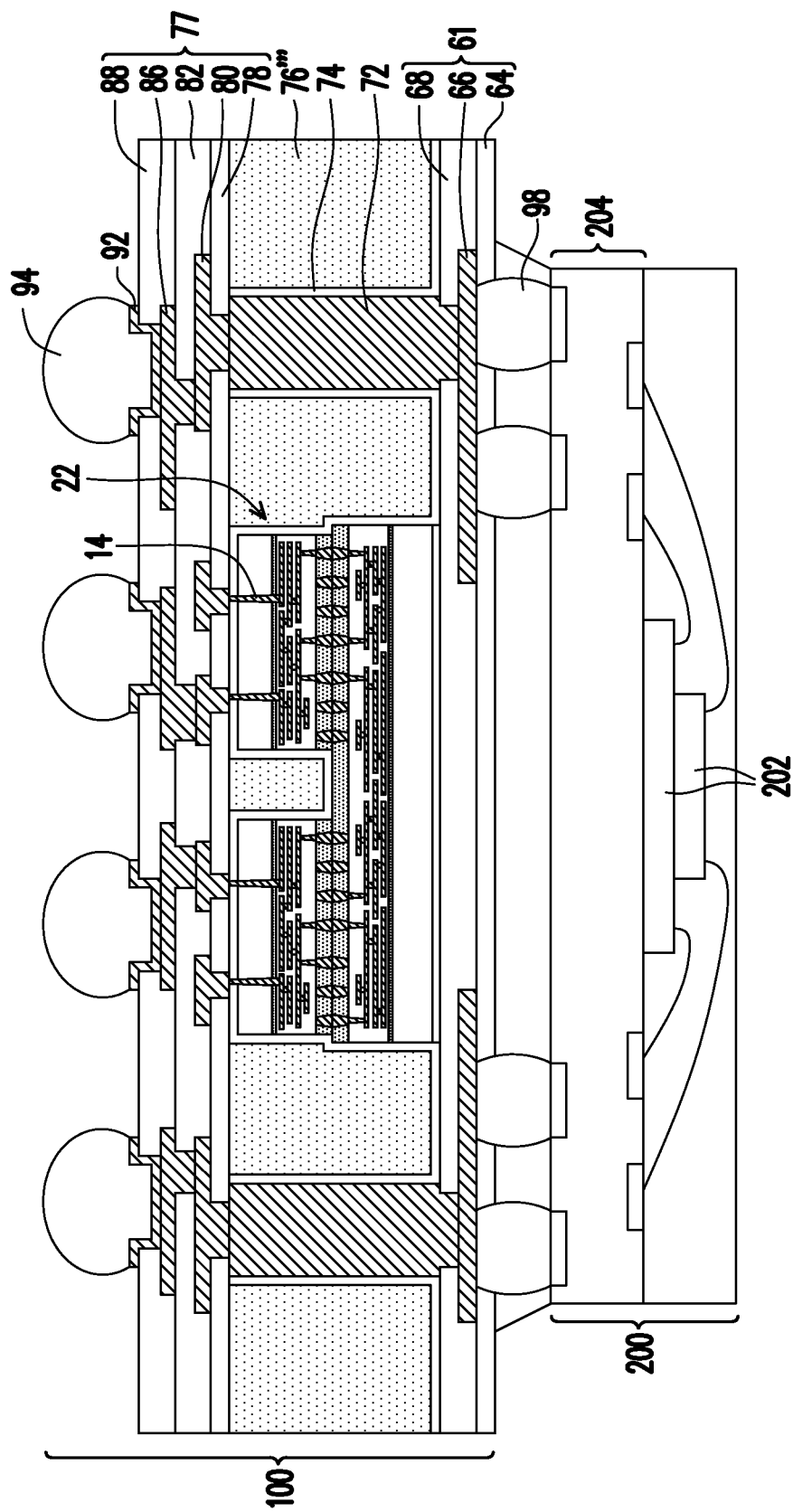

FIGS. 4A through 4N are cross-sectional views schematically illustrating a process flow for fabricating integrated fan-out package structures of SoIC dies in accordance with some alternative embodiments of the present disclosure.

Referring to FIGS. 4A through 4D, similar processes and/or materials may be used as those discussed above with reference to FIGS. 2A through 2D.

Referring FIG. 4E, after forming the conductive through vias 72, at least one singulated SoIC die, such as the singulated SoIC die 22 shown in FIG. 1D, is picked-up and placed over the dielectric layer 68 of the redistribution circuit structure 61. Only a single singulated SoIC die 22 and its surrounding conductive through vias 72 are illustrated in FIG. 4E for illustrative purposes. It is noted, however, that the process steps shown in FIGS. 4A through 4N may be performed on a plurality of regions at a wafer level, and may be performed on all of the singulated SoIC dies 22 and the conductive through vias 72 disposed over the carrier 60 in some embodiments. As illustrated in FIG. 4E, the top tier semiconductor dies 20 are stacked over the bottom tier semiconductor die 21, and the back surface of the bottom tier semiconductor die 21 in the singulated SoIC die 22 is adhered to the dielectric layer 68 through the die-attachment film 19. In some embodiments, the die-attachment film 19 is an adhesive film (e.g., epoxy film, silicone film, and so on).

After the singulated SoIC die 22 is mounted over the dielectric layer 68, a removal process is performed to partially remove the substrates 12 of the top tier semiconductor dies 20 until the through substrate vias 14 protrude from the back surfaces of the substrates 12. In some embodiments, the substrates 12 are silicon substrates, a silicon recessing process is performed to partially remove (e.g., thin down) the substrates 12, wherein an isotropic etch process is utilized to partially remove the substrates 12 such that the through substrate vias 14 protrude from the back surfaces of the substrates 12, and an etchant used to etch the substrates 12 includes sulfur hexafluoride ($SF_6$) or other suitable etchant. Level height difference between the top ends of the through substrate vias 14 and the back surfaces of the substrates 12 may be in a range from about 1 micrometer to about 2 micrometers.

After the partial removal process of the substrates 12 is performed, a dielectric layer 74 is conformally formed over the redistribution circuit structure 61 to cover the SoIC die 22 and the conductive through vias 72. In some embodiments, the material of the dielectric layer 74 may be silicon oxide ($SiO_x$, where x>0), silicon nitride ($SiN_x$, where x>0), silicon oxynitride ($SiO_xN_y$, where x>0 and y>0) or other suitable dielectric material. The thickness of the dielectric layer 74 may range from about 4 micrometers to about 6 micrometers.

Referring to FIG. 4F, an insulating encapsulation material 76 is formed on the dielectric layer 74 which covers the redistribution circuit structure 61, the SoIC die 22 and the conductive through vias 72. The insulating encapsulation material 76 may be a molding compound (e.g., epoxy or other suitable resin) formed through an over-molding process. The insulating encapsulation material 76 fills the gaps between neighboring conductive through vias 72, the gaps between the top tier semiconductor dies 20, and the gaps between the conductive through vias 72 and the SoIC die 22. The top surface of the insulating encapsulation material 76 is higher than the top ends of the through substrate vias 14, the back surface of the top tier semiconductor dies 20 and the conductive through vias 72.

Next, as shown in FIG. 4G, a planarization such as a Chemical Mechanical Polish (CMP) process and/or a mechanical grinding process is performed to partially remove the insulating encapsulation material 76 and the dielectric layer 74 until the through substrate vias 14 protruding from the top tier semiconductor dies 20 are exposed. After the insulating encapsulation material 76 and the dielectric layer 74 are partially removed, an insulating encapsulant 76''' is formed to laterally encapsulate the SoIC die 22 and the conductive through vias 72. Due to the planarization, the top ends of conductive through vias 72 and the top ends of the through substrate vias 14 are substantially level or coplanar with the top surface of the insulating encapsulant 76''', within process variations. In the illustrated exemplary embodiments, the planarization is performed until the through substrate vias 14 protruding from the top tier semiconductor dies 20 are exposed. Furthermore, after forming the insulating encapsulant 76''', a portion of the dielectric layer 74 which covers the back surfaces of the top tier semiconductor dies 20 are exposed, and the top surface of the exposed portion of the dielectric layer 74 is substantially level or coplanar with the top surface of the insulating encapsulant 76''', within process variations.

As shown in FIG. 4G, the insulating encapsulant 76''' may fill the gaps between the top tier semiconductor dies 20. The insulating encapsulant 76''' is spaced apart from the SoIC die 22 and the conductive through vias 72 by the dielectric layer 74. In some embodiments, the insulating encapsulant 76''' includes a first encapsulation portion 76a and a second encapsulation portion 76b. The first encapsulation portion 76a is disposed on the dielectric layer 74 and is located above portions of the bonding dielectric layer 17a of the bottom tier semiconductor die 21 which are not covered by the top tier semiconductor dies 20. The first encapsulation portion 76a fills the gaps between the top tier semiconductor dies 20 and is spaced apart from sidewalls of the top tier semiconductor dies 20 by the dielectric layer 74. By depositing the dielectric layer 74, the first encapsulation portion 76a is spaced apart from the portions of the bonding dielectric layer 17a of the bottom tier semiconductor die 21 which are not covered by the top tier semiconductor dies 20. The through substrate vias 14 protruding from the back surfaces of the top tier semiconductor dies 20 penetrate through the dielectric layer 74. The thickness T1 of the first encapsulation portion 76a is less than that of the top tier semiconductor dies 20 due to the dielectric layer 74. The second encapsulation portion 76b laterally encapsulates the SoIC die 22 and the first encapsulation portion 76a. The second encapsulation portion 76b is continuous with the first encapsulation portion 76a and spaced apart from sidewalls of the top tier semiconductor die 20 and the bottom tier semiconductor die 21 by the dielectric layer 74. Furthermore, the second encapsulation portion 76b is spaced apart from the conductive through vias 72 and the redistribution circuit structure 61 by the dielectric layer 74. The thickness T2 of the second encapsulation portion 76b is less than an overall thickness of the SoIC die 22 and the die-attachment film 19 due to the dielectric layer 74. It is noted that, the substrates 12 of the top tier semiconductor dies 20 are still covered by the dielectric layer 74 and not revealed at this stage.

FIG. 4H through 4M illustrate formation of a redistribution circuit structure 77 and solder regions. As shown in FIGS. 4H through 4L, a redistribution circuit structure 77 including a dielectric layer 78, redistribution wirings 80, a dielectric layer 82, redistribution wirings 86, and a dielectric layer 88 is formed on the top ends of conductive through vias 72, the top ends of the through substrate vias 14, and the insulating encapsulant 76''', wherein the dielectric layer 78 covers the dielectric layer 74, the insulating encapsulant 76''' and the conductive through vias 72. The redistribution circuit structure 77 is spaced apart from the SoIC die 22 by the dielectric layer 74. As shown in FIG. 4M, solder regions including Under-Bump Metallurgies (UBMs) 92 and electrical connectors 94 disposed on the UBMs 92 are formed on the redistribution circuit structure 77.

Referring to FIGS. 4H through 4M, similar processes and materials may be used as discussed above with reference to FIGS. 2H through 2M.

In the above-mentioned embodiments, since the insulating encapsulant 76', 76'' and 76''' are formed through a single molding process followed by a CMP process and/or a mechanical grinding process, process time and manufacturing cost may be reduced. Furthermore, reliability and process yield may be enhanced.

In accordance with some embodiments of the disclosure, a package structure including a device die, an insulating encapsulant, and a first redistribution circuit is provided. The device die includes a first semiconductor die and a second semiconductor die. The first semiconductor die is stacked over and electrically connected to the second semiconductor die. The insulating encapsulant laterally encapsulates the device die. The insulating encapsulant includes a first encapsulation portion and a second encapsulation portion connected to the first encapsulation portion. The first encapsulation portion is disposed on the second semiconductor die and laterally encapsulates the first semiconductor die. The second encapsulation portion laterally encapsulates the first insulating encapsulation and the second semiconductor die. The first redistribution circuit structure is disposed on the device die and a first surface of the insulating encapsulant, and the first redistribution circuit structure is electrically connected to the device die. In some embodiments, the first semiconductor die comprising a first bonding structure, the second semiconductor die comprising a second bonding structure, and the first bonding structure is bonded to the second bonding structure. In some embodiments, the first bonding structure comprises a first bonding dielectric layer and first bonding conductors embedded in the first bonding dielectric layer, the second bonding structure comprises a second bonding dielectric layer and first bonding conductors embedded in the second bonding dielectric layer, the first bonding conductors are bonded with the second bonding conductors, and the first bonding dielectric layer is bonded with a first portion of the second bonding dielectric layer. In some embodiments, the first encapsulation portion of the insulating encapsulant is in contact with a second portion of the second bonding dielectric layer, and the second portion of the second bonding dielectric layer is not covered by the first bonding dielectric layer. In some embodiments, the first encapsulation portion of the insulating encapsulant is in contact with sidewalls of the first semiconductor die, and the second encapsulation portion of the insulating encapsulant is in contact with sidewalls of the second semiconductor die. In some embodiments, the insulating encapsulant further comprises a third encapsulation portion disposed on the first semiconductor die, the third encapsulation portion is connected to and laterally encapsulated by the first encapsulation portion. In some embodiments, the first semiconductor die comprises through semiconductor vias penetrating through the third encapsulation portion and electrically connected to the first redistribution circuit structure. In some embodiments, the package structure further includes a dielectric layer covering the device die, wherein the device die is spaced apart from the insulating encapsulant by the dielectric layer. In some embodiments, the package structure further includes: a conductive through vias disposed aside the device die, wherein the conductive through vias penetrate through the second encapsulation portion of the insulating encapsulant; and a second redistribution circuit structure disposed on the device die and a second surface of the insulating encapsulant, wherein the second redistribution circuit structure is electrically connected to the first redistribution circuit structure through the conductive through vias. In some embodiments, the package structure further includes a dielectric layer covering the device die and sidewalls of the conductive through vias, wherein the device die and the conductive through vias are spaced apart from the insulating encapsulant by the dielectric layer.

In accordance with some other embodiments of the disclosure, a package structure including a bottom tier semiconductor die, at least one top tier semiconductor die, an insulating encapsulant, and a first redistribution circuit structure is provided. The bottom tier semiconductor die includes a first semiconductor substrate, a first interconnect structure disposed on the first semiconductor die, and a first bonding structure disposed on and electrically connected to the first interconnect structure. The at least one top tier semiconductor die includes a second semiconductor substrate, through semiconductor vias protruding from a back surface of the second semiconductor substrate, a second interconnect structure disposed on the second semiconductor die, and a second bonding structure disposed on and electrically connected to the second interconnect structure. The second bonding structure is bonded with a portion of the first bonding structure, and a lateral dimension of the bottom tier semiconductor die is greater than that of the top tier semiconductor die. The insulating encapsulant covers the first semiconductor die and the second semiconductor die. The first redistribution circuit structure is disposed on the top tier semiconductor and a top surface of the insulating encapsulant, wherein the through semiconductor vias penetrate through the insulating encapsulant and electrically connected to the first redistribution circuit structure. In some embodiment, a portion of the insulating encapsulant covers the back surface of the second semiconductor substrate, and the through semiconductor vias penetrate through the portion of the insulating encapsulant. In some embodiment, the insulating encapsulant includes a first encapsulation portion disposed on and in contact with the first bonding structure of the bottom tier semiconductor die; a second encapsulation portion laterally encapsulating the first encapsulation portion and the bottom tier semiconductor die; and a third encapsulation portion covering the back surface of the second semiconductor substrate of the top tier semiconductor die, wherein the first encapsulation portion laterally encapsulates the third encapsulation portion and the top tier semiconductor die. In some embodiment, the top tier semiconductor die is spaced apart from the first redistribution circuit structure by the insulating encapsulant. In some embodiment, the package structure further includes a conductive through vias penetrating through the insulating encapsulant; and a second redistribution circuit structure disposed on a bottom surface of the insulating encapsulant, wherein the second redistribution circuit structure is electrically connected to the first redistribution circuit structure through the conductive through vias.

In accordance with some other embodiments of the disclosure, a package structure including a bottom tier semiconductor die, at least one top tier semiconductor die, a dielectric layer, and an insulating encapsulant is provided. The at least one top tier semiconductor die is bonded with the bottom tier semiconductor die, a lateral dimension of the bottom tier semiconductor die is greater than that of the top tier semiconductor die, and the top tier semiconductor die includes through semiconductor vias protruding from a back surface thereof. The dielectric layer covering the bottom tier semiconductor die and the top tier semiconductor die, and the through semiconductor vias penetrate through a portion of the dielectric layer which covers the back surface of the top tier semiconductor die. The insulating encapsulant laterally encapsulates the first semiconductor die and the second semiconductor die such that the bottom tier semiconductor die and the top tier semiconductor die are spaced apart from the insulating encapsulant by the dielectric layer. In some embodiments, the package structure further includes a first redistribution circuit structure disposed on the top tier semiconductor and a top surface of the insulating encapsulant, wherein the through semiconductor vias penetrate through the portion of the dielectric layer and electrically connected to the first redistribution circuit structure. In some embodiments, the first redistribution circuit structure is spaced apart from the insulating encapsulant by the dielectric layer. In some embodiments, the package structure further includes: a conductive through vias penetrating through the insulating encapsulant; and a second redistribution circuit structure disposed on a bottom surface of the insulating encapsulant, wherein the second redistribution circuit structure is electrically connected to the first redistribution circuit structure through the conductive through vias. In some embodiments, the conductive through vias and the second redistribution circuit structure are spaced apart from the insulating encapsulant by the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a first semiconductor die, wherein the first semiconductor die comprises a first bonding structure;
a second semiconductor die, wherein the second semiconductor die comprises a second bonding structure, the first semiconductor die being stacked over and electrically connected to the second semiconductor die, wherein the first bonding structure is bonded to the second bonding structure;
an insulating encapsulant laterally encapsulating the first semiconductor die and the second semiconductor die, the insulating encapsulant comprising a first encapsulation portion and a second encapsulation portion continuous with the first encapsulation portion, the first encapsulation portion being disposed on the second semiconductor die and laterally encapsulating the first semiconductor die, and the second encapsulation portion laterally encapsulating the first encapsulation portion and the second semiconductor die; and
a first redistribution circuit structure disposed on the first semiconductor die, the second semiconductor die, and a first surface of the insulating encapsulant, wherein the first redistribution circuit structure is electrically connected to the first semiconductor die.

2. The package structure of claim 1, wherein the first bonding structure comprises a first bonding dielectric layer and first bonding conductors embedded in the first bonding dielectric layer, the second bonding structure comprises a second bonding dielectric layer and second bonding conductors embedded in the second bonding dielectric layer, the first bonding conductors are bonded to the second bonding conductors, and the first bonding dielectric layer is bonded to a first portion of the second bonding dielectric layer.

3. The package structure of claim 2, wherein the first encapsulation portion of the insulating encapsulant is in contact with a second portion of the second bonding dielectric layer, and the second portion of the second bonding dielectric layer is not covered by the first bonding dielectric layer.

4. The package structure of claim 1, wherein the first encapsulation portion of the insulating encapsulant is in contact with sidewalls of the first semiconductor die, and the second encapsulation portion of the insulating encapsulant is in contact with sidewalls of the second semiconductor die.

5. The package structure of claim 1, wherein the insulating encapsulant further comprises a third encapsulation portion disposed on the first semiconductor die, the third encapsulation portion is continuous with and laterally encapsulated by the first encapsulation portion.

6. The package structure of claim 1, wherein the first encapsulation portion and the second encapsulation portion are a same material.

7. The package structure of claim 1 further comprising a dielectric layer covering the first semiconductor die and the second semiconductor die, wherein the first semiconductor die and the second semiconductor die are spaced apart from the insulating encapsulant by the dielectric layer.

8. The package structure of claim 1 further comprising:
conductive through vias disposed aside the second semiconductor die, wherein the conductive through vias penetrate through the second encapsulation portion of the insulating encapsulant; and
a second redistribution circuit structure, wherein the second semiconductor die is interposed between the first semiconductor die and the second redistribution circuit structure, wherein the second redistribution circuit structure is electrically connected to the first redistribution circuit structure through the conductive through vias.

9. The package structure of claim 8 further comprising a dielectric layer covering the first semiconductor die and sidewalls of the conductive through vias, wherein the first semiconductor die and the conductive through vias are spaced apart from the insulating encapsulant by the dielectric layer.

10. The package structure of claim 7, wherein the dielectric layer is between the first semiconductor die and first redistribution structure.

11. A package structure, comprising:
a bottom tier semiconductor die comprising a first semiconductor substrate, a first interconnect structure disposed on the first semiconductor substrate, and a first bonding structure disposed on and electrically connected to the first interconnect structure;
a top tier semiconductor die comprising a second semiconductor substrate, through substrate vias protruding from a back surface of the second semiconductor substrate, a second interconnect structure disposed on the second semiconductor substrate, and a second bonding structure disposed on and electrically connected to the second interconnect structure, the second bonding structure being bonded with a portion of the first bonding structure, wherein a lateral dimension of the bottom tier semiconductor die is greater than a lateral dimension of the top tier semiconductor die;
an insulating encapsulant covering the bottom tier semiconductor die and the top tier semiconductor die; and
a first redistribution circuit structure disposed on the top tier semiconductor die and a top surface of the insulating encapsulant, wherein the through substrate vias penetrate through the insulating encapsulant, wherein the through substrate vias are electrically connected to the first redistribution circuit structure.

12. The package structure of claim 11, wherein a portion of the insulating encapsulant covers the back surface of the second semiconductor substrate, wherein the through substrate vias penetrate through the portion of the insulating encapsulant.

13. The package structure of claim 11, wherein the insulating encapsulant comprises:
a first encapsulation portion disposed on and in contact with the first bonding structure of the bottom tier semiconductor die;
a second encapsulation portion laterally encapsulating the first encapsulation portion and the bottom tier semiconductor die; and
a third encapsulation portion covering the back surface of the second semiconductor substrate of the top tier semiconductor die, wherein the first encapsulation portion laterally encapsulates the third encapsulation portion and the top tier semiconductor die.

14. The package structure of claim 11, wherein the top tier semiconductor die is spaced apart from the first redistribution circuit structure by the insulating encapsulant.

15. The package structure of claim 11 further comprising:
a conductive through via penetrating through the insulating encapsulant; and
a second redistribution circuit structure disposed on a bottom surface of the insulating encapsulant, wherein the second redistribution circuit structure is electrically connected to the first redistribution circuit structure through the conductive through via.

16. A package structure, comprising:
a bottom tier semiconductor die;
a top tier semiconductor die bonded with the bottom tier semiconductor die, a lateral dimension of the bottom tier semiconductor die being greater than that of the top tier semiconductor die, and the top tier semiconductor die comprising through substrate vias protruding from a back surface of the top tier semiconductor die;
a dielectric layer covering the bottom tier semiconductor die and the top tier semiconductor die, wherein the through substrate vias penetrate through a portion of the dielectric layer on the back surface of the top tier semiconductor die; and
an insulating encapsulant laterally encapsulating the bottom tier semiconductor die and the top tier semiconductor die such that the bottom tier semiconductor die and the top tier semiconductor die are spaced apart from the insulating encapsulant by the dielectric layer.

17. The package structure of claim 16 further comprising:
a first redistribution circuit structure disposed on the top tier semiconductor die and a top surface of the insulating encapsulant, wherein the through substrate vias are electrically connected to the first redistribution circuit structure.

18. The package structure of claim 17, wherein the first redistribution circuit structure is spaced apart from the insulating encapsulant by the dielectric layer.

19. The package structure of claim 17 further comprising:
a conductive through via penetrating through the insulating encapsulant; and
a second redistribution circuit structure disposed on a bottom surface of the insulating encapsulant, wherein the second redistribution circuit structure is electrically connected to the first redistribution circuit structure through the conductive through via.

20. The package structure of claim 19, wherein the conductive through via and the second redistribution circuit structure are spaced apart from the insulating encapsulant by the dielectric layer.

* * * * *